United States Patent
Loy et al.

(10) Patent No.: US 12,193,243 B2
(45) Date of Patent: Jan. 7, 2025

(54) LATERAL MULTI-BIT MEMORY DEVICES AND METHODS OF MAKING THE SAME

(71) Applicant: GlobalFoundries Singapore Pte. Ltd., Singapore (SG)

(72) Inventors: Desmond Jia Jun Loy, Singapore (SG); Eng Huat Toh, Singapore (SG); Shyue Seng Tan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 482 days.

(21) Appl. No.: 17/650,084

(22) Filed: Feb. 7, 2022

(65) Prior Publication Data

US 2023/0255034 A1 Aug. 10, 2023

(51) Int. Cl.
*H10B 63/00* (2023.01)
*H10N 70/00* (2023.01)
*H10N 70/20* (2023.01)

(52) U.S. Cl.
CPC .......... *H10B 63/82* (2023.02); *H10N 70/011* (2023.02); *H10N 70/24* (2023.02); *H10N 70/823* (2023.02); *H10N 70/841* (2023.02)

(58) Field of Classification Search
CPC ...... H10B 63/82; H10B 63/00; H10N 70/011; H10N 70/24; H10N 70/823; H10N 70/841; H10N 70/068; H10N 70/828; H10N 70/8416; H10N 70/8833
See application file for complete search history.

(56) References Cited

U.S. PATENT DOCUMENTS 8,067,766 B2 * 11/2011 Hsu .................. H10N 70/20
257/42
8,395,927 B2 * 3/2013 Kreupl .............. H10N 70/883
365/163

OTHER PUBLICATIONS

Huang et al., Low-power resistive random access memory by confining the formation of conducting filaments, AIP Advances, 2016, pp. 1-8, vol. 6 (065022), AIP Publishing.
Choi et al., Tip-enhanced electric field-driven efficient charge injection and transport in organic material-based resistive memories, Applied Materials Today, 2020, pp. 1-8, vol. 20 (100746), ELSEVIER.
Niu et al., Geometric conductive filament confinement by nanotips for resistive switching of HfO2-RRAM devices with high performance, Scientific Reports, 2016, vol. 6 (25757), pp. 1-9, Nature.

(Continued)

*Primary Examiner* — Allison Bernstein
(74) *Attorney, Agent, or Firm* — David Cain

(57) ABSTRACT

The disclosed subject matter relates generally to structures, memory devices and methods of forming the same. More particularly, the present disclosure relates to resistive random-access (ReRAM) memory devices having two resistive layers and a conductive layer arranged between two electrodes. The present disclosure provides a memory device including a first electrode above an interlayer dielectric region, a second electrode above the interlayer dielectric region, the second electrode is laterally adjacent to the first electrode, a conductive layer between the first electrode and the second electrode, in which the conductive layer is electrically isolated, a first resistive layer between the first electrode and the conductive layer, and a second resistive layer between the second electrode and the conductive layer.

20 Claims, 16 Drawing Sheets

(56) References Cited

OTHER PUBLICATIONS

Parthasarathi Pal et al., Interconversion of complementary resistive switching from graphene oxide based bipolar multilevel resistive switching device, Applied Physics Letters, Aug. 2020, vol. 117—Issue No. 5, AIP Publishing.

Geetika Khurana et al., Non-Polar and Complementary Resistive Switching Characteristics in Graphene Oxide devices with Gold Nanoparticles: Diverse Approach for Device Fabrication, Scientific Reports, 2019, vol. 9 (15103) pp. 1-10, Nature.

* cited by examiner

LATERAL MULTI-BIT MEMORY DEVICES AND METHODS OF MAKING THE SAME

FIELD OF THE INVENTION

The disclosed subject matter relates generally to memory devices and methods of forming the same. More particularly, the present disclosure relates to resistive random-access (ReRAM) memory devices having two resistive layers and a conductive layer arranged between two electrodes.

BACKGROUND

Semiconductor devices and integrated circuit (IC) chips have found numerous applications in the fields of physics, chemistry, biology, computing, and memory devices. An example of a memory device is a non-volatile (NV) memory device. NV memory devices are programmable and have been extensively used in electronic products due to their ability to retain data for long periods, even after the power has been turned off. Exemplary categories for NV memory may include resistive random-access memory (ReRAM), erasable programmable read-only memory (EPROM), flash memory, ferroelectric random-access memory (FeRAM), and magnetoresistive random-access memory (MRAM).

Resistive memory devices can operate by changing (or switching) between two different states: a high resistance state (HRS), which may be representative of an off or '0' state; and a low resistance state (LRS), which may be representative of an on or '1' state. However, these devices may experience large variations in resistive switching characteristics and may cause large fluctuations of current flow within the device, which decreases the performance of the device and increases its power consumption. Furthermore, NV memory devices may also be programmed as memory cells, each cell storing bits of binary information. However, the operation of resistive memory devices may be limited to two resistance states, e.g., the HRS and the LRS, thereby limiting these devices to be programmed as single cell memory devices.

SUMMARY

In an aspect of the present disclosure, there is provided a memory device including a first electrode above an interlayer dielectric region, a second electrode above the interlayer dielectric region, the second electrode is laterally adjacent to the first electrode, a conductive layer between the first electrode and the second electrode, in which the conductive layer is electrically isolated, a first resistive layer between the first electrode and the conductive layer, and a second resistive layer between the second electrode and the conductive layer.

In another aspect of the present disclosure, there is provided a memory device including a first electrode above an interlayer dielectric region, a second electrode above the interlayer dielectric region, the second electrode is laterally adjacent to the first electrode, a conductive layer between the first electrode and the second electrode, wherein the conductive layer is electrically isolated, a first resistive layer between the first electrode and the conductive layer, a second resistive layer between the second electrode and the conductive layer, and a spacer element between the second electrode and the second resistive layer.

In yet another aspect of the present disclosure, there is provided a method of forming a memory device. The method includes forming a first electrode above an interlayer dielectric region, forming a second electrode above the interlayer dielectric region, the second electrode is laterally adjacent to the first electrode, forming a conductive layer between the first electrode and the second electrode, in which the conductive layer is electrically isolated, forming a first resistive layer between the first electrode and the conductive layer, and forming a second resistive layer between the second electrode and the conductive layer.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Figure 1A:
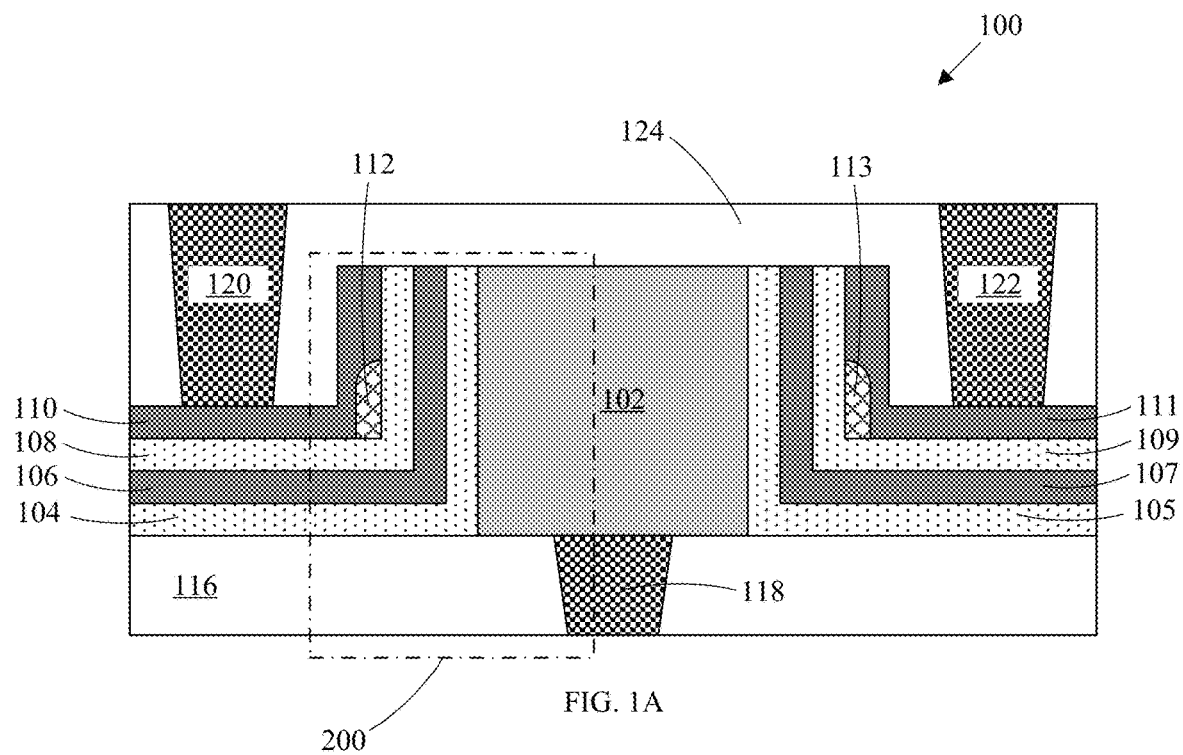
FIG. 1A and FIG. 1B are cross-sectional views of exemplary memory devices.

Various illustrative embodiments of the present disclosure are described below. The embodiments disclosed herein are exemplary and not intended to be exhaustive or limiting to the present disclosure.

Referring to FIG. 1A, FIG. 1B, FIG. 5A through FIG. 5D, FIG. 6, FIG. 10A through FIG. 10D, FIG. 11, and FIG. 15A through FIG. 15D, the exemplary memory devices 100 disclosed herein includes a first electrode 102 above an interlayer dielectric region 116, a second electrode 110 above the interlayer dielectric region 116, in which the second electrode 110 is laterally adjacent to the first electrode 102, a conductive layer 106 between the first electrode 102 and the second electrode 110, a first resistive layer 104 between the first electrode 102 and the conductive layer 106, and a second resistive layer 108 between the second electrode 110 and the conductive layer 106. The conductive layer 106 is electrically isolated such that there is no current or voltage passing through the conductive layer 106 and the conductive layer 106 is not electrically connected to a power supply. The memory device 100 may further include a spacer element 112 between the first electrode 102 and the second electrode 110.

In some implementations, the memory device 100 may further include a third electrode 111 above the interlayer dielectric region 116. The third electrode 111 may be laterally adjacent to the first electrode 102 such that the first electrode 102 may be positioned laterally between the third electrode 111 and the second electrode 110. A second conductive layer 107 may be between the first electrode 102 and the third electrode 111. A third resistive layer 105 may be between the first electrode 102 and the second conductive layer 107, and a fourth resistive layer 109 may be between the third electrode 111 and the second conductive layer 107. The second conductive layer 107 is electrically isolated such that there is no current or voltage passing through the second conductive layer 107 and the second conductive layer 107 is not electrically connected to a power supply. A second spacer element 113 may be between the first electrode 102 and the third electrode 111.

The first electrode 102 may be structured as an active electrode while the second electrode 110 and the third electrode 111 may be structured as inert electrodes. Alternatively, the first electrode 102 may be structured as an inert electrode while the second electrode 110 and the third electrode 111 may be structured as active electrodes. The first electrode 102 may have a thickness in the range of about 20 nm to about 40 nm. The second electrode 110 and the third electrode 111 may each have a thickness in the range of about 5 nm to about 7 nm. The term "thickness", when used to characterize a thickness of an electrode described herein, may be measured as a distance between an upper surface of the electrode and a lower surface of the electrode.

As used herein, the term "active electrode" may refer to an electrode having a conductive material that is capable of being oxidized and/or reduced (i.e., redox reactions) to generate electric charges for a formation of a conductive path in the resistive layers 104, 105, 108, 109. Examples of the conductive material in the active electrode may include a metal such as, but not limited to, tantalum (Ta), hafnium (Hf), titanium (Ti), copper (Cu), silver (Ag), cobalt (Co), tungsten (W), or an alloy thereof. Conversely, the term "inert electrode" may refer to a conductive material that is capable of resisting redox reactions. Examples of the conductive material for the inert electrode may include, but are not limited to, ruthenium (Ru), platinum (Pt), titanium nitride (TiN), tantalum nitride (TaN).

The conductive layers 106, 107 may include the same material as those of the active electrode. For example, if the first electrode 102 is structured as the active electrode, then the conductive layers 106, 107 may include the same material as that of the first electrode 102. The conductive layers 106, 107 may have a thickness in the range of about 3 nm to about 5 nm.

The resistive layers 104, 105, 108, 109 may be configured to have a switchable resistance in response to a change in an electric signal. Examples of the material for the resistive layers 104, 105, 108, 109 may include, but are not limited to, carbon polymers, perovskites, silicon dioxide, metal oxides, or nitrides. Some examples of metal oxides may include lanthanide oxides, tungsten oxide, copper oxide, cobalt oxide, silver oxide, zinc oxide, nickel oxide, niobium oxide, titanium oxide, hafnium oxide, aluminum oxide, tantalum oxide, zirconium oxide, yttrium oxide, scandium oxide, magnesium oxide, chromium oxide, and vanadium oxide. Examples of nitrides may include boron nitride and aluminum nitride. The resistive layers 104, 105, 108, 109 may each have a thickness that is engineered such that a relatively low voltage level may be sufficient to switch the resistance states of the respective resistive layers 104, 105, 108, 109. Preferably, the resistive layers 104, 105, 108, 109 may each have a thickness in the range of about 3 nm to about 5 nm.

The spacer elements 112, 113 may include a nitride or an oxide. Examples of the nitride may include, but are not limited to, silicon nitride, silicon oxynitride. Examples of the oxide may include, but are not limited to, silicon dioxide, tetraethyl orthosilicate (TEOS), or a material having a chemical composition of $SiC_xO_yH_z$, wherein x, y, and z are in stoichiometric ratio. The spacer elements 112, 113 may include a different material from the resistive layers 104, 105, 108, 109.

In the examples shown in FIG. 1A and FIG. 1B, the spacer element 112 (hereinafter referred to as the "first spacer element 112") may be between the second electrode 110 and the second resistive layer 108 and the second spacer element 113 may be between the third electrode 111 and the fourth resistive layer 109. In some embodiments, the first resistive layer 104 and the third resistive layer 105 may be in direct contact with side surfaces of the first electrode 102. The first conductive layer 106 may be disposed on or directly on the first resistive layer 104 and the second conductive layer 107 may be disposed on or directly on the third resistive layer 105. The second resistive layer 108 may be disposed on or directly on the first conductive layer 106 and the fourth resistive layer 109 may be disposed on or directly on the second conductive layer 107. The first spacer element 112 may be disposed on or directly on the second resistive layer 108 and the second spacer element 113 may be disposed on or directly on the fourth resistive layer 109. The second electrode 110 may be disposed on or directly on the second resistive layer 108 and the first spacer element 112 and may cover the first spacer element 112. The third electrode 111 may be disposed on or directly on the fourth resistive layer 109 and the second spacer element 113 and may cover the second spacer element 113.

Figure 1B:
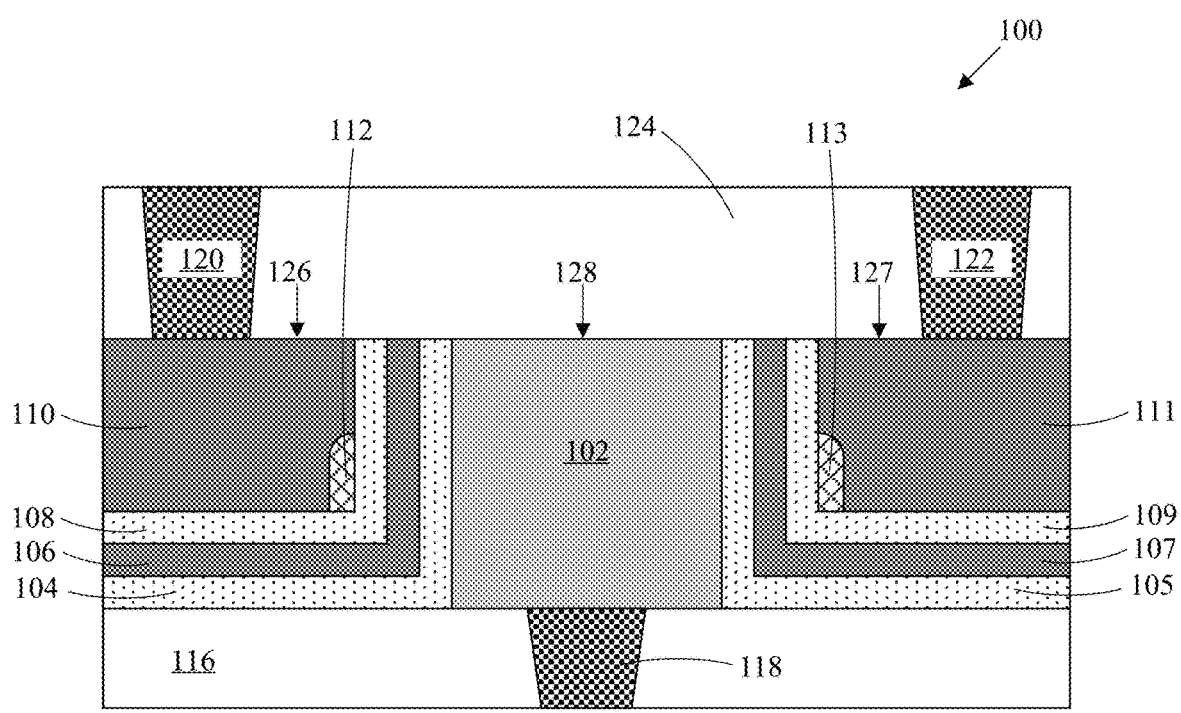

In the example shown in FIG. 1B, the second electrode 110 may have an upper surface 126 and the third electrode 111 may have an upper surface 127. In some embodiments, the upper surface 126 of the second electrode 110 and the upper surface 127 of the third electrode 111 may be planar. In other embodiments (not shown), the upper surface 126 of the second electrode 110 and the upper surface 127 of the third electrode 111 may each have a concave profile. The first electrode 102 may have an upper surface 128. The upper surface 128 of the first electrode 102 may be planar, or alternatively (not shown), the upper surface 128 of the first electrode may have a concave profile. In some embodiments, the upper surface 126 of the second electrode 110 and the upper surface 127 of the third electrode 111 may be substantially coplanar with the upper surface 128 of the first electrode 102.

Figure 1C:
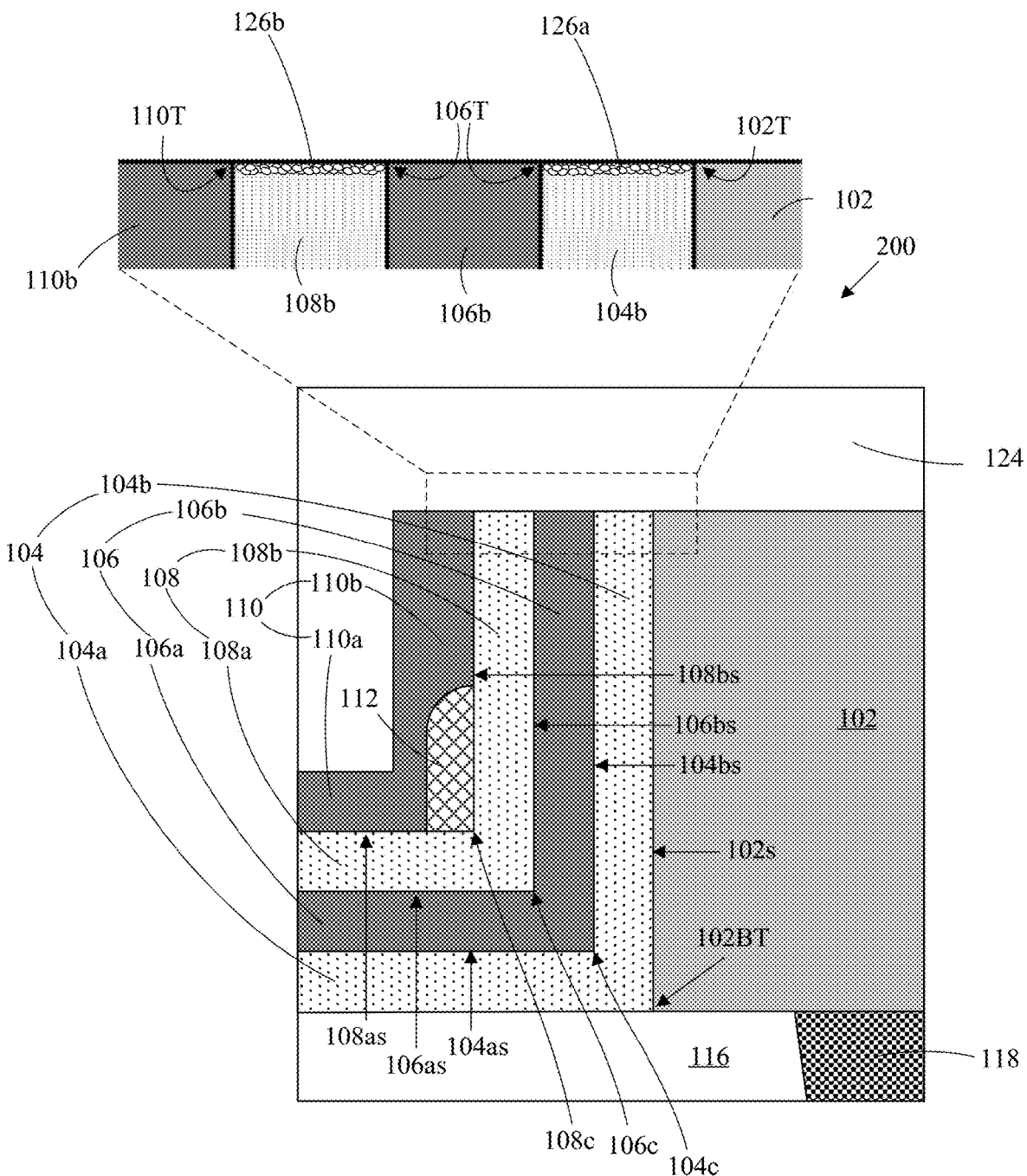
FIG. 1C is an enlarged cross-sectional view of the structure shown in FIG. 1A.

Referring to FIG. 1C, an enlarged cross-sectional view of a portion 200 of the memory device 100 in FIG. 1A is presented. The first resistive layer 104 and the second resistive layer 108 may be configured to have a switchable resistance in response to a change in an electric signal. The first resistive layer 104 may include a conductive path 126a (e.g., an electric filament) configured to form between the conductive layer 106 and the first electrode 102, while the second resistive layer 108 may include a conductive path 126b (e.g., an electric filament) configured to form between the conductive layer 106 and the second electrode 110, in response to the change in the electric signal. The presence of the conductive paths 126a, 126b may reduce the resistance of the resistive layers 104, 108 while the absence of the conductive paths 126a, 126b may increase the resistance of the resistive layers 104, 108, thereby enabling a controllable resistive nature of the respective resistive layers 104, 108. The resistive layers 104, 108 may exhibit resistive changing properties characterized by different resistance states of the material forming these layers. Those resistance states (e.g., a high resistance state (HRS) or a low resistance state (LRS)) may be used or programmed to represent one or more bits of information.

The second electrode 110 may have an upper edge 110T. The conductive layer 106 may have upper edges 106T. The first electrode 102 may have an upper edge 102T. The conductive path 126b formed in the second resistive layer 108 may link the upper edge 110T of the second electrode 110 with the upper edge 106T of the conductive layer 106. Likewise, the conductive path 126a formed in the first resistive layer 104 may link the upper edge 106T of the conductive layer 106 with the upper edge 102T of the first electrode 102.

As shown in FIG. 1C, the second electrode 110 may be structured as a layer having a vertical portion 110b and a horizontal portion 110a. The second resistive layer 108 may have a vertical portion 108b and a horizontal portion 108a. The horizontal portion 108a of the second resistive layer 108 may have an upper surface 108as and the vertical portion 108b of the second resistive layer 108 may have a side surface 108bs. The upper surface 108as of the horizontal portion 108a may join the side surface 108bs of the vertical portion 108b to provide a corner 108c in the second resistive layer 108. The conductive layer 106 may have a vertical portion 106b and a horizontal portion 106a. The horizontal portion 106a of the conductive layer 106 may have an upper surface 106as and the vertical portion 106b of the conductive layer 106 may have a side surface 106bs. The upper surface 106as of the horizontal portion 106a may join the side surface 106bs of the vertical portion 106b to provide a corner 106c in the conductive layer 106. The first resistive layer 104 may have a vertical portion 104b and a horizontal portion 104a. The horizontal portion 104a of the first resistive layer 104 may have an upper surface 104as and the vertical portion 104b of the first resistive layer 104 may have a side surface 104bs. The upper surface 108as of the horizontal portion 104a may join the side surface 104bs of the vertical portion 104b to provide a corner 104c in the first resistive layer 104.

The first electrode 102 may have a side surface 102s. The vertical portion 104b of the first resistive layer 104 may be positioned over the side surface 102s of the first electrode 102. The conductive layer 106 may be positioned over the first resistive layer 104, the second resistive layer 108 may be positioned over the conductive layer 106, and the second electrode 110 may be positioned over the second resistive layer 108.

A strong localization of electric fields (i.e., the largest concentration of electric charges) can be found at the respective upper edges 110T, 106T, 102T. With a strong localization of electric fields, the conductive paths 126a, 126b formed between the first electrode 102 and the conductive layer 106, and between the conductive layer 106 and the second electrode 110 can be confined, and do not form randomly along the length of the resistive layers 104, 108.

The first spacer element 112 may be disposed on or directly on the second resistive layer 108 to cover the corner 108c in the second resistive layer 108. The first electrode 102 may have a lower edge 102BT. A strong localization of electric field may also be found at the corner 106c of the conductive layer 106 and the lower edge 102BT of the first electrode 102. The first spacer element 112 may function as an electrical insulator by covering the corner 108c in the second resistive layer 108 to prevent the formation of any conductive path linking the second electrode 110 with the corner 106c of the conductive layer 106. The covering of the corner 108c in the second resistive layer 108 with the first spacer element 112 may advantageously ensure confinement of the conductive paths 126a, 126b at the respective upper edges 110T, 106T, 102T.

The confinement of the conducting paths 126a, 126b may help to reduce the stochasticity of its formation, which in turn reduces the cycle-to-cycle and device-to-device variability of the memory devices in the high resistive state. In other words, the variability of the resistance of the resistive layers 104, 108 in the high resistive state may be reduced. This may enable a stable switching of the resistive states in the resistive layers 104, 108 during the operation of the device and may reduce its overall power consumption.

Referring again to FIG. 1B, in embodiments where the upper surface 126 of the second electrode 110, the upper surface 127 of the third electrode 111, and the upper surface 128 of the first electrode 102 have concave profiles, sharp edges may be created between the upper surfaces 126, 127, 128 and the side surfaces of the respective electrodes 110, 111, 102. The presence of sharp edges at the upper surfaces 126, 127, 128 may enable strong localization of electric fields. The electric fields localized at the sharp edges may ensure that the conductive paths formed across the electrodes 110, 111, 102 do not form randomly along their respective sides, and remain confined at their respective sharp edges.

Referring again to FIG. 1A, FIG. 1B, FIG. 5A through FIG. 5D, FIG. 6, FIG. 10A through FIG. 10D, FIG. 11, and FIG. 15A through FIG. 15D, the first electrode 102, the second electrode 110, and the third electrode 111 may be connected to various interconnect structures to send or receive electrical signals between other circuitry and/or active components in a memory device. Examples of the active components (not shown) that may be connected to the electrodes 102, 110, 111 may include diodes (e.g., a bi-directional diode, a single-photon avalanche diode, etc.) or transistors such as, but are not limited to, planar field-effect transistor, fin-shaped field-effect transistors (FinFETs), ferroelectric field-effect transistors (FeFETs), complementary metal-oxide semiconductor (CMOS) transistors, and bi-polar junction transistors (BJT).

For example, the first electrode 102 may be disposed on an interconnect via 118. Interconnect vias 120, 122 may be disposed on the second electrode 110 and the third electrode 111. The interconnect vias 118, 120, 122 may include a metal such as copper, cobalt, aluminum, or an alloy thereof. The interconnect via 118 may be formed in a first interlayer dielectric region 116 while the interconnect vias 120, 122 may be formed in a second interlayer dielectric region 124. Examples of dielectric material in the interlayer dielectric regions 116, 124 may include, but are not limited to, silicon dioxide, tetraethyl orthosilicate (TEOS), or a material having a chemical composition of $SiC_xO_yH_z$, wherein x, y, and z are in stoichiometric ratio.

The first electrode 102, the second electrode 110, and the third electrode 111 may be individually connected to a conductive line (not shown) through the respective interconnect vias 118, 120, 122. The conductive lines connected to the electrodes 102, 110, 111 may be configured as source lines, word lines, and bit lines. As used herein, the terms "source line(s)", "bit line(s)", and "word line(s)" refer to electrical terminal connections that link memory cells in a device circuit. In an implementation, the first electrode 102 may be connected to a source line while the second electrode 110 and the third electrode 111 may be individually connected to a bit line.

As described above, the conductive layers 106, 107 are electrically isolated and are not connected to any interconnect vias or conductive lines. As an illustrative example, the first electrode 102, the first resistive layer 104, and the first conductive layer 106 may provide a first one-bit memory cell. The second electrode 110, the second resistive layer 108, and the first conductive layer 106 may provide a second one-bit memory cell. When a change in an electrical signal (e.g., a voltage) is applied across the first electrode 102 and the second electrode 110, the first resistive layer 104 and the second resistive layer 108 may individually exhibit two resistive states (e.g., HRS or LRS). By controlling the magnitude and the direction of the voltage across the electrodes 102, 110, the combination of the two resistive states in each of the resistive layers 104, 108 may be configured to provide four resistive states between the electrode 102, 110, thereby enabling the representation of multiple bits of information. Thus, the positioning of the first conductive layer 106 between the first electrode 102 and the second electrode 110 may advantageously enable a multi-bit cell configuration. Additionally, by ensuring that the conductive layer 106 is electrically isolated, the memory cells may have a smaller structure and a smaller device footprint since there is no interconnect structure (e.g. a via) resting upon or connecting to the conductive layer 106.

The presence of the conductive layers 106, 107 may also shorten the length of the conductive paths connecting the respective electrodes 102, 110, 111. For example, the positioning of first conductive layer 106 between the first electrode 102 and the second electrode 110 may enable the formation of a shorter conductive path in the each of the resistive layers 104, 108. In contrast, an absence of the first conductive layer 106 may result in the formation of a longer conductive path to connect the first electrode 102 and the second electrode 110. A shorter length of the conductive paths formed in the resistive layers 104, 108 may be more stable as compared to a longer conductive path, and therefore may decrease variability in the switching mechanism of the memory devices described herein.

The memory devices described herein may be a resistive memory device. Examples of the resistive memory device may include, but are not limited to, oxide random-access memory (OxRAM) or conductive bridge random-access memory (CBRAM).

FIGS. 2 through 4B show a set of steps that may be used to create the memory device shown in FIG. 1A, FIG. 1B, and FIG. 1C.

As used herein, "deposition techniques" refer to the process of applying a material over another material (or the substrate). Exemplary techniques for deposition include, but are not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD).

Additionally, "patterning techniques" include deposition of material or photoresist, patterning, exposure, development, etching, cleaning, and/or removal of the material or photoresist as required in forming a described pattern, structure, or opening. Examples of techniques for patterning include, but are not limited to, wet etch lithographic processes, dry etch lithographic processes, or direct patterning processes. Such techniques may use mask sets and mask layers.

Figure 2:
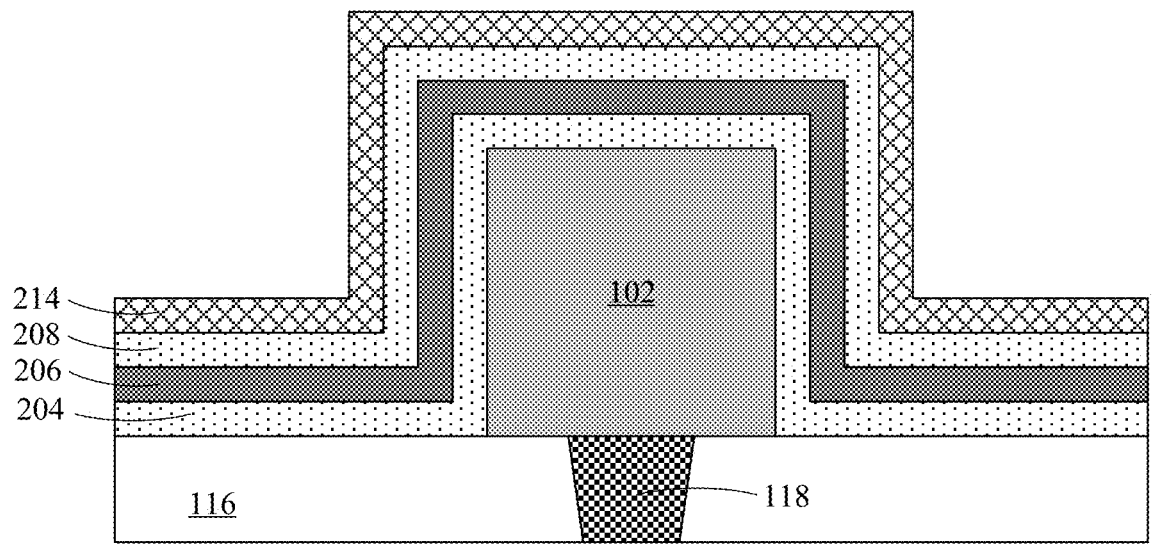
FIG. 2, FIG. 3, FIG. 4A, and FIG. 4B are cross-sectional views depicting a set of steps for fabricating an exemplary memory device.

Referring to FIG. 2, a first interlayer dielectric region 116 may be formed above active components of an integrated circuit chip (e.g., in a back end of line portion). For example, the first interlayer dielectric region 116 may be formed above a substrate (not shown). Interconnect via 118 may be formed in the first interlayer dielectric region 116. The interconnect via 118 may be formed by patterning the first interlayer dielectric region 116 to form openings, and then filling the openings with a metal. A first electrode 102 may be formed on the first interlayer dielectric region 116 and in contact with the interconnect via 118. Formation of the first electrode 102 may include the deposition of a conductive material layer followed by the patterning of the deposited layer.

A first material resistive layer 204 may be formed on the first interlayer dielectric region 116 and the first electrode 102. The first material resistive layer 204 may cover the upper surface and the side surface of the first electrode 102. A conductive layer 206 may be formed on the first resistive material layer 204. A second resistive material layer 208 may be formed on the conductive layer 206. A spacer element layer 214 may be formed on the second resistive material layer 208. Formation of the layers 204, 206, 208, 214 may be performed, for example, using deposition techniques described herein. Preferably, a conformal deposition process such as an ALD process or a highly conformal CVD process may be used. The term "conformal" used herein may refer to a deposition technique in which the deposited material conforms to the contours of the surface or structure being deposited on. The conformal deposition process may provide the deposited layers 204, 206, 208, 214 with a uniform thickness.

Figure 3:
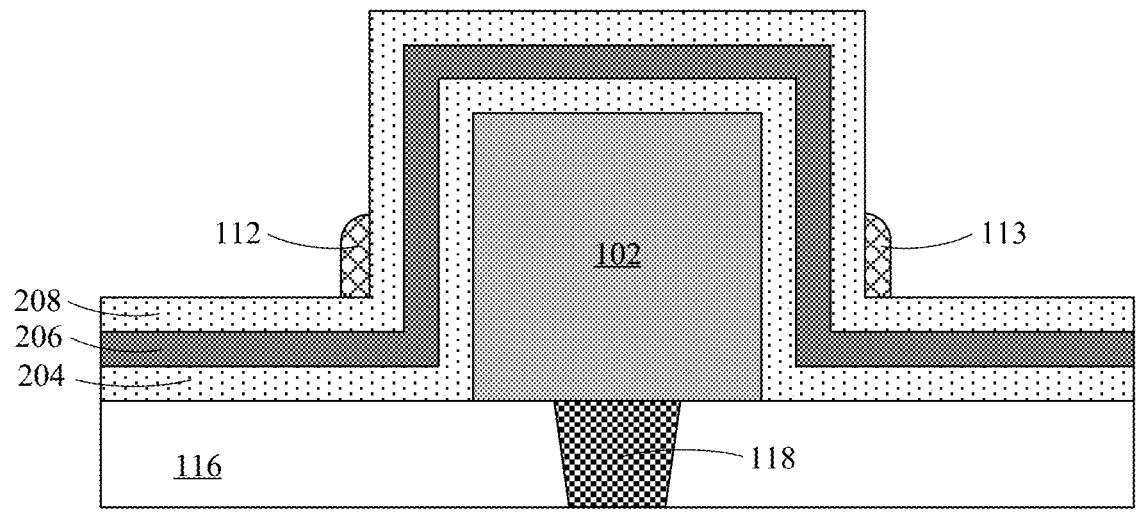

Referring to FIG. 3, the spacer element layer 214 may be etched to form the spacer elements 112, 113. The etching of the spacer element layer 214 may expose portions of the underlying second resistive material layer 208. As described herein, the formed spacer elements 112, 113 may cover corners in the second resistive material layer 208. The etching of the spacer element layer 214 may include the use of an anisotropic etching process (i.e., directional etching), in which the etching may be performed in a substantially vertical direction.

Figure 4A:
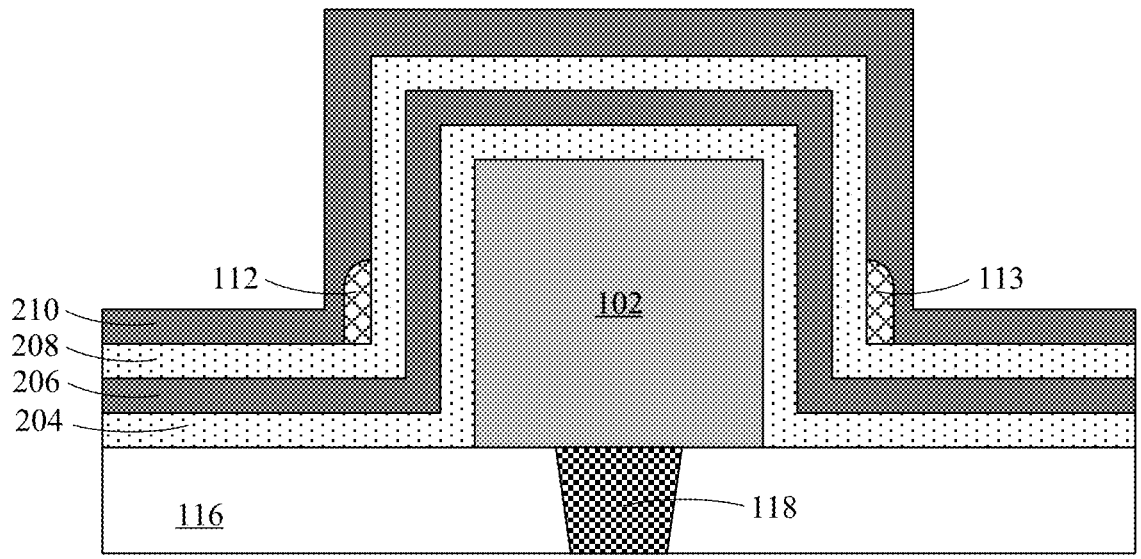

Referring to FIG. 4A (FIG. 4A continues from the structure shown in FIG. 3), an electrode layer 210 may be formed on the second resistive material layer 208 and the spacer elements 112, 113. The electrode layer 210 may be formed using the deposition techniques described herein and may cover the spacer elements 112, 113. In the example shown in FIG. 4A, a conformal deposition process such as an ALD process or a highly conformal CVD process may be used.

The structure in FIG. 4A may be subjected to further processing to form the structure shown in FIG. 1A. For example, a chemical mechanical planarization (CMP) process may be performed to expose the upper surface of the first electrode 102. The CMP process may be stopped upon exposing the upper surface of the first electrode 102. The CMP process may remove a portion of the layers 210, 208, 206, 204. The first 104 and the third 105 resistive layers may be formed from the deposited layer 204 after the CMP process. The first 106 and the second 107 conductive layers may be formed from the deposited layer 206 after the CMP process. The second 108 and the fourth 109 resistive layers may be formed from the layer 208 after the CMP process. The second electrode 110 and the third electrode 111 may be formed from the layer 210 after the CMP process. Subsequently, a second interlayer dielectric region 124 may be formed over the electrodes 102, 110, 111, the resistive layers 104, 105, 108, 109, and the conductive layers 106, 107, followed by patterning the material in the second interlayer dielectric region 124 to provide openings for the formation of interconnect vias 120, 122. The interconnect vias 120, 122 may be formed using a damascene process.

Figure 4B:
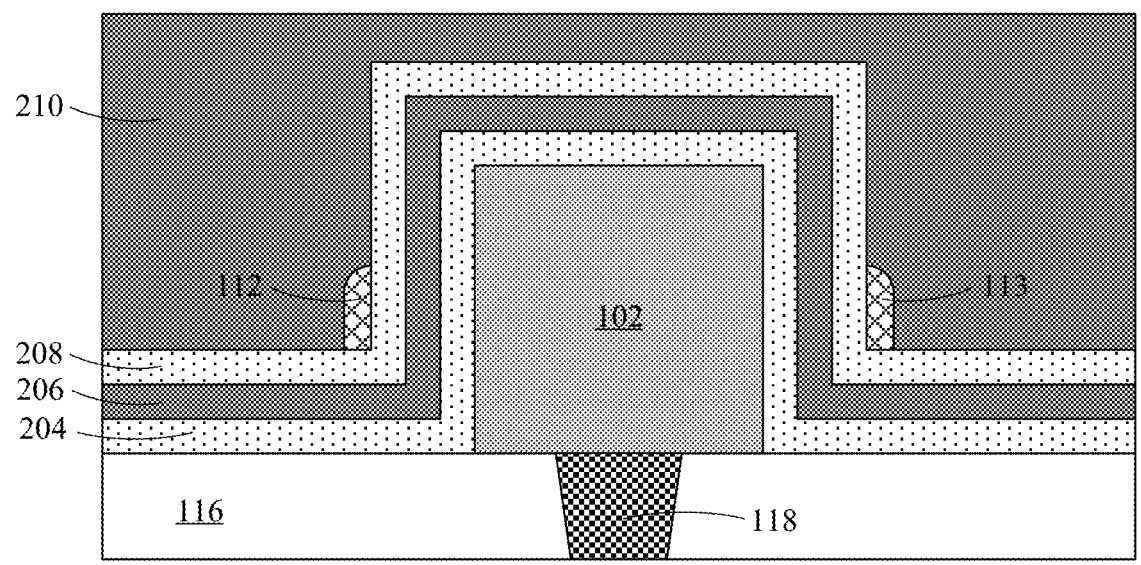

Referring to FIG. 4B (FIG. 4B continues from the structure shown in FIG. 3), an alternative step of forming the electrode layer 210 is presented. The electrode layer 210 may be formed using the deposition techniques described herein and may cover the spacer elements 112, 113. In the example shown in FIG. 4B, the electrode layer 210 may be formed using a non-conformal deposition process, instead of the conformal deposition process described in FIG. 4A.

The structure in FIG. 4B may be subjected to further processing to form the structure shown in FIG. 1B. For example, a chemical mechanical planarization (CMP) process may be performed to expose the upper surface of the first electrode 102. The CMP process may be stopped upon exposing the upper surface of the first electrode 102. The CMP process may remove a portion of the layers 210, 208, 206, 204. The first 104 and the third 105 resistive layers may be formed from the deposited layer 204 after the CMP process. The first 106 and the second 107 conductive layers may be formed from the deposited layer 206 after the CMP process. The second 108 and the fourth 109 resistive layers may be formed from the layer 208 after the CMP process. The second electrode 110 and the third electrode 111 may be formed from the layer 210 after the CMP process. The second electrode 110 and the third electrode 111 may have respective upper surfaces that are substantially coplanar with the upper surface of the first electrode 102 after the CMP process. Subsequently, a second interlayer dielectric region 124 may be formed over the electrodes 102, 110, 111, the resistive layers 104, 105, 108, 109, and the conductive layers 106, 107, followed by patterning the material in the second interlayer dielectric region 124 to provide openings for the formation of interconnect vias 120, 122. The interconnect vias 120, 122 may be formed using a damascene process.

FIG. 5A through FIG. 5D depict modifications of the example memory device shown in FIG. 1A, in which the example memory devices 100 includes oxygen scavenging layers 114, 115. The terms "oxygen scavenging", "oxygen scavenger", "oxygen enhancement", or "oxygen exchange" may refer to a composition, layer, film, or material that can consume, deplete, or react with oxygen ions from a given environment.

Figure 5A:
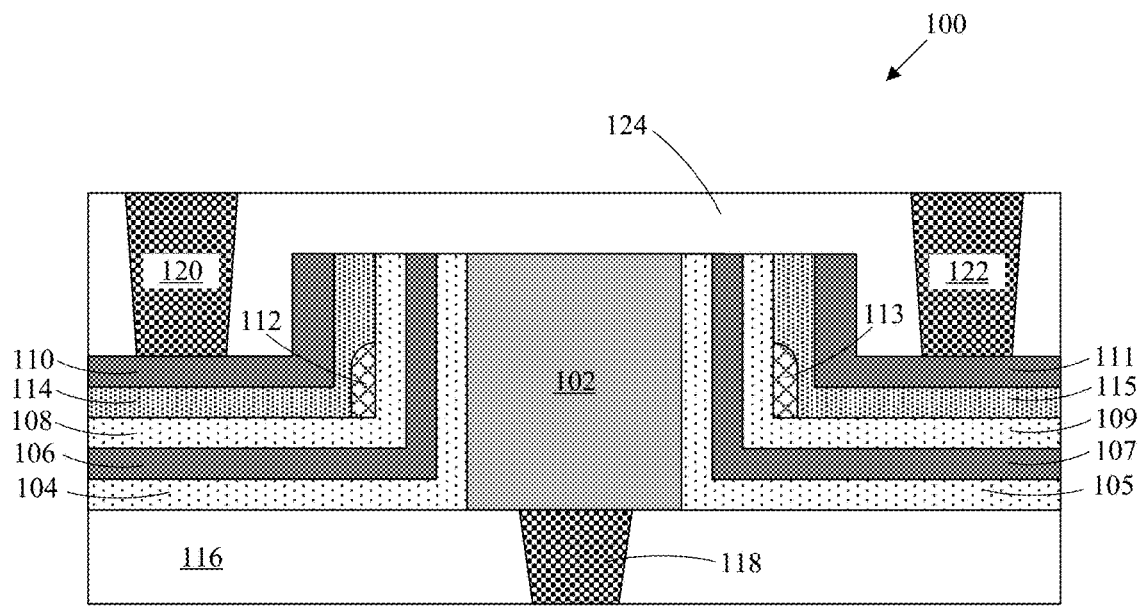
FIG. 5A through FIG. 5D are cross-sectional views of exemplary memory devices including an oxygen scavenging layer.

As shown in FIG. 5A, a first oxygen scavenging layer 114 may be between the second electrode 110 and the second resistive layer 108. The first oxygen scavenging layer 114 may be in direct contact with the second electrode 110. The first oxygen scavenging layer 114 may also be disposed on or directly on the second resistive layer 108 and the first spacer element 112. A second oxygen scavenging layer 115 may be between the third electrode 111 and the fourth resistive layer 109. The second oxygen scavenging layer 115 may be in direct contact with the third electrode 111. The second oxygen scavenging layer 115 may also be disposed on or directly on the fourth resistive layer 109 and the second spacer element 113.

Figure 5B:
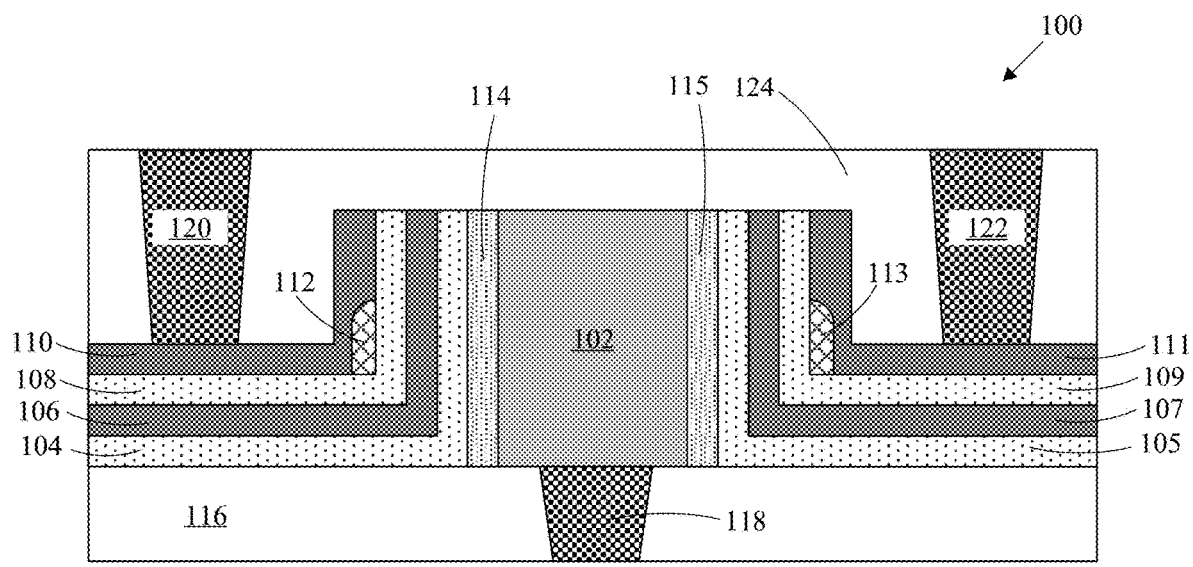

As shown in FIG. 5B, a first oxygen scavenging layer 114 may be between the first electrode 102 and the first resistive layer 104. A second oxygen scavenging layer 114 may be between the first electrode 102 and the third resistive layer 105. The oxygen scavenging layers 114, 115 may be in direct contact with the first electrode 102. For example, the oxygen scavenging layers 114, 115 may be disposed on or directly on the side surfaces of the first electrode 102.

Figure 5C:
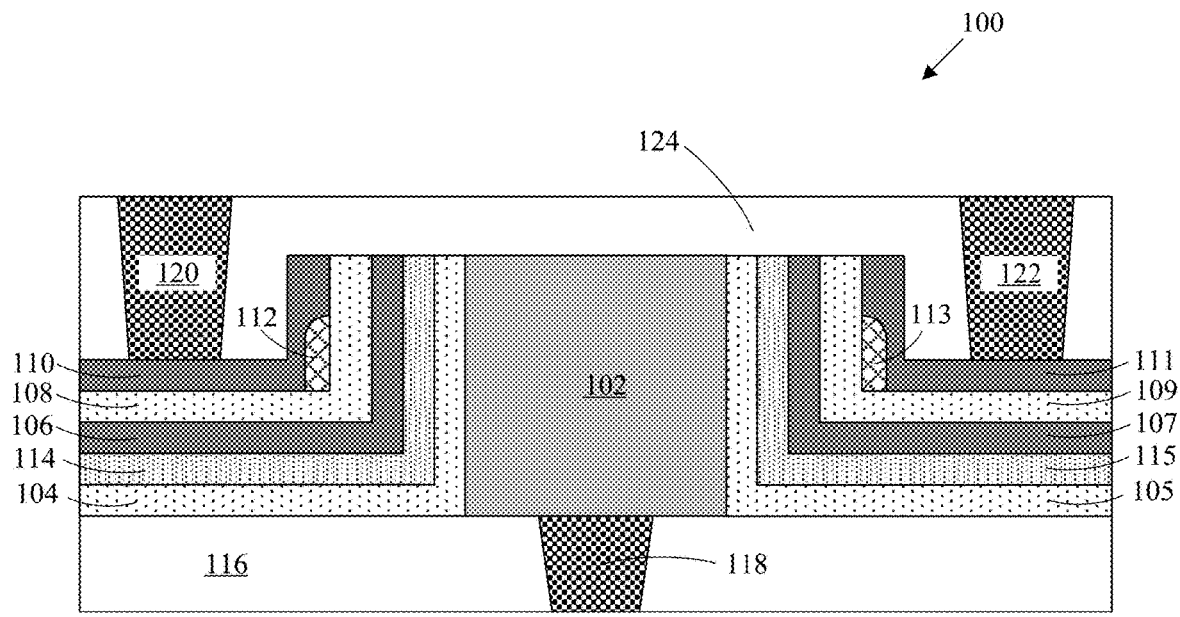

As shown in FIG. 5C, a first oxygen scavenging layer 114 may be between the first conductive layer 106 and the first resistive layer 104. The first oxygen scavenging layer 114 may be in direct contact with the conductive layer 106. The first oxygen scavenging layer 114 may also be disposed on or directly on the first resistive layer 104. A second oxygen scavenging layer 115 may be between the second conductive layer 107 and the third resistive layer 105. The second oxygen scavenging layer 115 may be in direct contact with the second conductive layer 107. The second oxygen scavenging layer 115 may also be disposed on or directly on the third resistive layer 105. The oxygen scavenging layers 114, 115 may have a vertical portion and a horizontal portion, and may have an L-shaped structure.

Figure 5D:
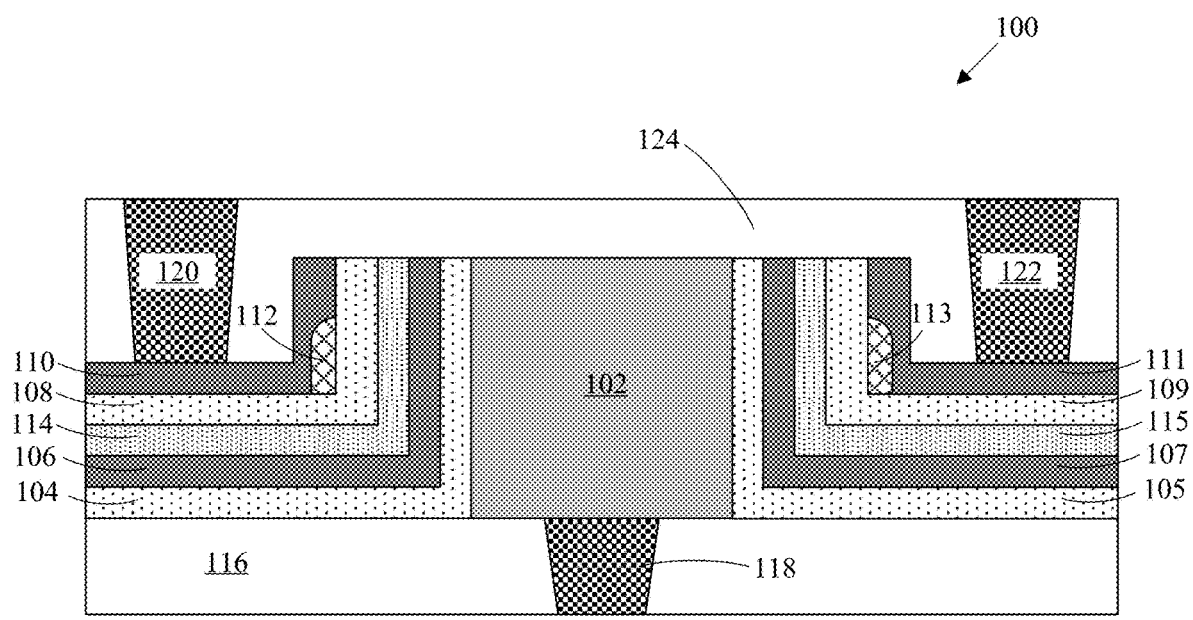

As shown in FIG. 5D, a first oxygen scavenging layer 114 may be between the first conductive layer 106 and the second resistive layer 108. The first oxygen scavenging layer 114 may be in direct contact with the first conductive layer 106. The second resistive layer 108 may be disposed on or directly on the first oxygen scavenging layer 114. A second oxygen scavenging layer 115 may be between the second conductive layer 107 and the fourth resistive layer 109. The second oxygen scavenging layer 115 may be in direct contact with the second conductive layer 107. The fourth resistive layer 109 may be disposed on or directly on the second oxygen scavenging layer 115. The oxygen scavenging layers 114, 115 may have a vertical portion and a horizontal portion, and may have an L-shape structure.

The oxygen scavenging layers 114, 115 may include a metal or a metal oxide. Examples of the metal oxides for the oxygen scavenging layers 114, 115 may include, but are not limited to, aluminum oxide ($Al_2O_3$), hafnium oxide ($HfO_2$), oxides of tungsten ($WO_x$), oxides of titanium ($TiO_x$), or oxides of tantalum ($Ta_nO_x$), where "x" may be an integer in the range of 2 to 5 and "n" may be 1 or 2. Examples of the metals for the oxygen scavenging layers 114, 115 may include, but are not limited to, tantalum (Ta), titanium (Ti), tungsten (W), or hafnium (Hf). Preferably, the oxygen scavenging layers 114, 115 may have a thickness in the range of about 1 nm to about 3 nm. The first oxygen scavenging layer 114 may include a different material from the second electrode 110 and the second oxygen scavenging layer 115 may include a different material from the third electrode 111. Additionally, the first oxygen scavenging layer 114 may include a different material from the first resistive layer 104 and the second resistive layer 108, and the second oxygen scavenging layer 115 may include a different material from the third resistive layer 105 and the fourth resistive layer 107.

The oxygen scavenging layers 114, 115 may be formed, for example, using the deposition techniques described herein, or by oxidation of the electrode 102 and the conductive layers 106, 107. In embodiments where the oxygen scavenging layers 114, 115 are formed using an oxidation process, the oxygen scavenging layers 114, 115 may include an oxide of the material in the electrode 102 and the conductive layers 106, 107. For example, a portion of the material in the electrode 102 and the conductive layers 106, 107 may be reacted with oxygen gas under an elevated temperature environment, while the remaining portion of the material in the electrode 102 and the conductive layers 106, 107 remain unreacted.

Figure 6:
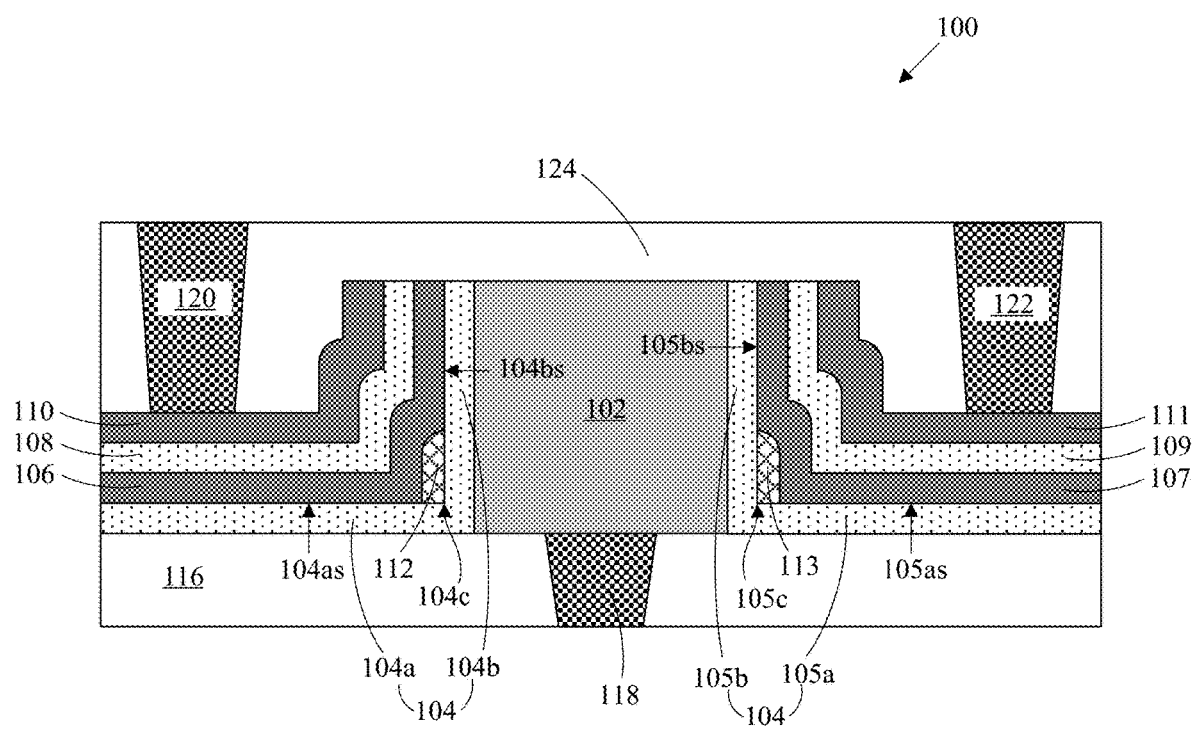
FIG. 6 is a cross-sectional view of another exemplary memory device.

Referring to FIG. 6, in which like reference numerals refer to like features in FIG. 1A, another example of a memory device 100 is presented. As shown, the first spacer element 112 may be between the first conductive layer 106 and the first resistive layer 104. The first resistive layer 104 may have a vertical portion 104b and a horizontal portion 104a. The horizontal portion 104a of the first resistive layer 104 may have an upper surface 104as and the vertical portion 104b of the first resistive layer 104 may have a side surface 104bs. The upper surface 104as of the horizontal portion 104a may join the side surface 104bs of the vertical portion 104b to provide a corner 104c in the first resistive layer 104. The first spacer element 112 may be disposed on or directly on the first resistive layer 104 to cover the corner 104c in the first resistive layer 104. The first conductive layer 106 may be positioned over the first resistive layer 104 and the first spacer element 112, the second resistive layer 108 may be positioned over the first conductive layer 106, and the second electrode 110 may be positioned over the second resistive layer 108. The first conductive layer 106 may be deposited to conform to the contours of the first spacer element 112 and the first resistive layer 104. Likewise, the second resistive layer 108 and the second electrode 110 may be deposited to conform to the contours of the first conductive layer 106.

Similarly, the second spacer element 113 may be between the second conductive layer 107 and the third resistive layer 105. The third resistive layer 105 may have a vertical portion 105b and a horizontal portion 105a. The horizontal portion 105a of the third resistive layer 105 may have an upper surface 105as and the vertical portion 105b of the third resistive layer 105 may have a side surface 105bs. The upper surface 105as of the horizontal portion 105a may join the side surface 105bs of the vertical portion 105b to provide a corner 105c in the third resistive layer 105. The second spacer element 113 may be disposed on or directly on the third resistive layer 105 to cover the corner 105c in the third resistive layer 105. The second conductive layer 107 may be positioned over the third resistive layer 105 and the second spacer element 113, the fourth resistive layer 109 may be positioned over the second conductive layer 107, and the third electrode 111 may be positioned over the fourth resistive layer 109. The second conductive layer 107 may be deposited to conform to the contours of the second spacer element 113 and the third resistive layer 105. Likewise, the fourth resistive layer 109 and the third electrode 111 may be deposited to conform to the contours of the second conductive layer 107.

In some embodiments, the vertical portion 104b of the first resistive layer 104 and the vertical portion 105b of the third resistive layer 105 may be in direct contact with the side surfaces of the first electrode 102. The first spacer element 112 may be disposed on or directly on the first resistive layer 104 and the second spacer element 113 may be disposed on or directly on the second resistive layer 105. The first conductive layer 106 may be disposed on or directly on the first resistive layer 104 and the first spacer element 112. The second conductive layer 107 may be disposed on or directly on the third resistive layer 105 and the second spacer element 113. The second resistive layer 108 may be disposed on or directly on the first conductive layer 106 and the fourth resistive layer 109 may be disposed on or directly on the second conductive layer 107. The second electrode 110 may be disposed on or directly on the second resistive layer 108 and the third electrode 111 may be disposed on or directly on the fourth resistive layer 109.

As mentioned above, the spacer elements 112, 113 may function as electrical insulators. The covering of the corner 104c in the first resistive layer 104 with the first spacer element 112 and the covering to the corner 105c in the third resistive layer 105 with the second spacer element 113 may advantageously ensure confinement of the conductive paths (not shown) at the respective upper edges of the electrodes 102, 110, 111 and the conductive layers 106, 107.

Although not shown in the accompanying drawings, the memory device 100 in FIG. 6 may be modified such that the second electrode 110 and the third electrode 111 may have respective upper surfaces that are substantially coplanar with an upper surface of the first electrode 102.

Figure 7:
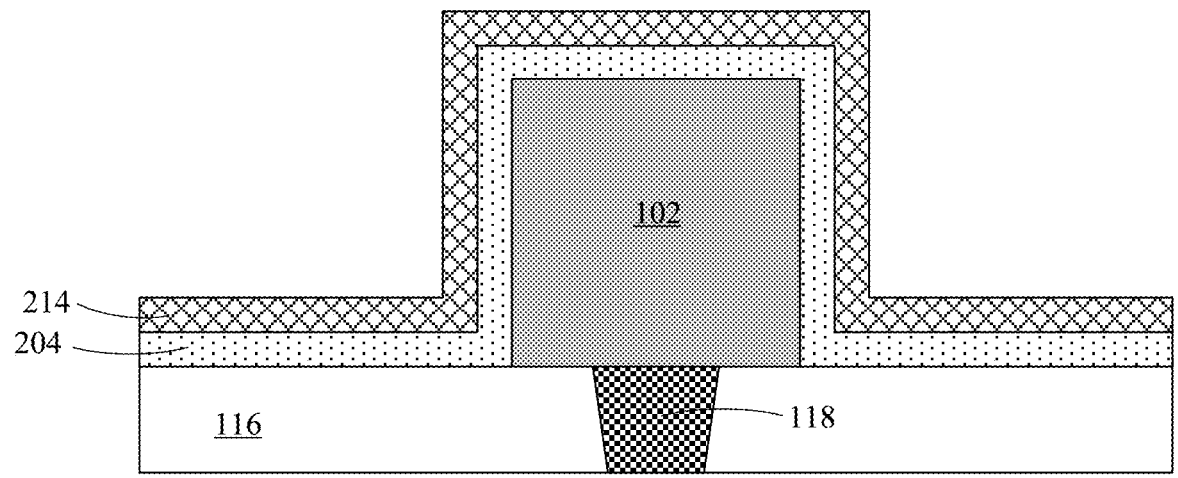
FIG. 7, FIG. 8, and FIG. 9 are cross-sectional views depicting another set of steps for fabricating an exemplary memory device.
Figure 8:
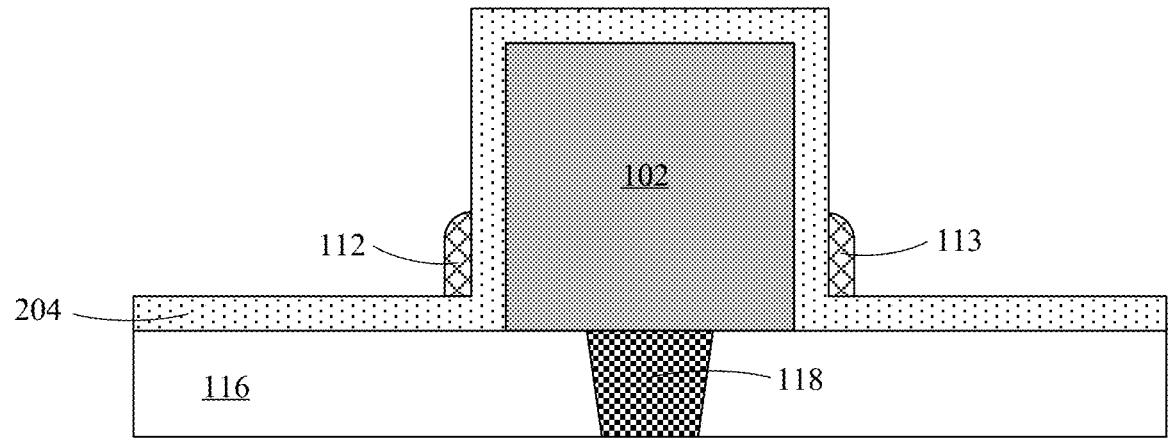
Figure 9:
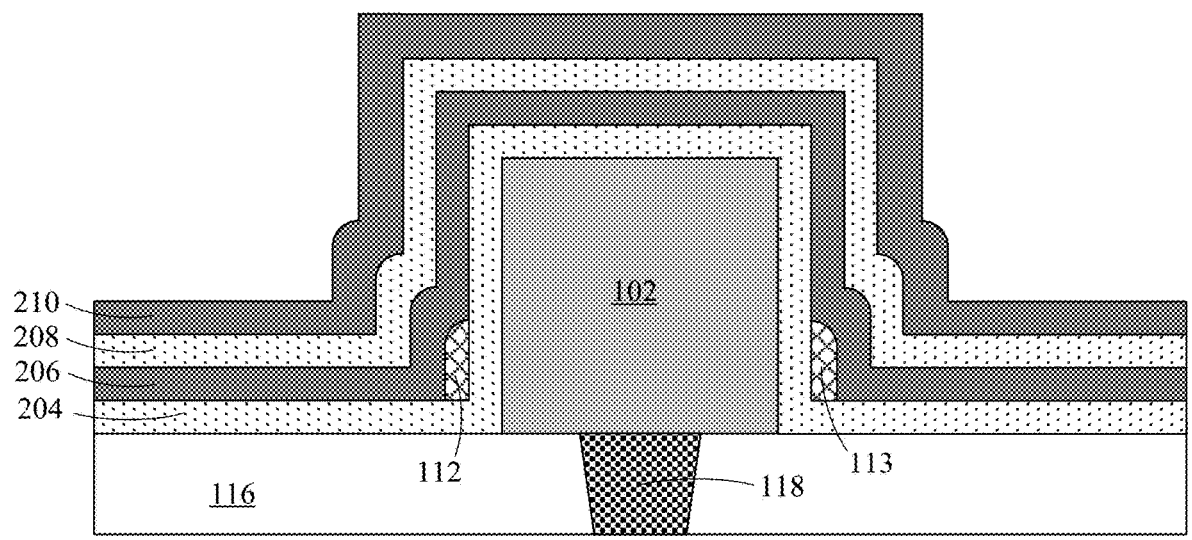

FIGS. 7 through 9 show a set of steps that may be used to create the memory device shown in FIG. 6.

Referring to FIG. 7, a first interlayer dielectric region 116 may be formed above active components of an integrated circuit chip (e.g., in a back end of line portion). For example, the first interlayer dielectric region 116 may be formed above a substrate (not shown). Interconnect via 118 may be formed in the first interlayer dielectric region 116. A first electrode 102 may be formed on the first interlayer dielectric region 116 and in contact with the interconnect via 118. Formation of the first electrode 102 may include the deposition of a conductive material layer followed by the patterning of the deposited layer.

A first resistive material layer 204 may be formed on the first interlayer dielectric region 116 and the first electrode 102. The first resistive material layer 204 may cover the upper surface and the side surface of the first electrode 102. A spacer element layer 214 may be formed on the first resistive material layer 204. Formation of the layers 204, 214 may be performed, for example, using deposition techniques described herein. Preferably, a conformal deposition process such as an ALD process or a highly conformal CVD process may be used.

Referring to FIG. 8, the spacer element layer 214 may be etched to form the spacer elements 112, 113. The etching of the spacer element layer 214 may expose portions of the underlying first resistive material layer 204. As described herein, the formed spacer elements 112, 113 may cover corners in the first resistive material layer 204. The etching of the spacer element layer 214 may include the use of an anisotropic etching process (i.e., directional etching), in which the etching may be performed in a substantially vertical direction.

Referring to FIG. 9, a conductive layer 206 may be formed on the first resistive material layer 204 and the spacer elements 112, 113. A second resistive material layer 208 may be formed on the conductive layer 206. An electrode layer 210 may be formed on the second resistive material layer 208. The layers 206, 208, 210 may be formed using the deposition techniques described herein. In the example shown in FIG. 9, a conformal deposition process such as an ALD process or a highly conformal CVD process may be used to deposit the layers 206, 208, 210. Alternatively, in another example (not shown), a conformal deposition process such as an ALD process or a highly conformal CVD process may be used to deposit the layers 206, 208, while a non-conformal deposition process may be used to deposit the layer 210.

The structure in FIG. 9 may be subjected to further processing to form the structure shown in FIG. 6. For example, a chemical mechanical planarization (CMP) process may be performed to expose the upper surface of the first electrode 102. The CMP process may be stopped upon exposing the upper surface of the first electrode 102. The CMP process may remove a portion of the layers 210, 208, 206, 204. The first 104 and the third 105 resistive layers may be formed from the deposited layer 204 after the CMP process. The first 106 and the second 107 conductive layers may be formed from the deposited layer 206 after the CMP process. The second 108 and the fourth 109 resistive layers may be formed from the layer 208 after the CMP process. The second electrode 110 and the third electrode 111 may be formed from the layer 210 after the CMP process. Subsequently, a second interlayer dielectric region 124 may be formed over the electrodes 102, 110, 111, the resistive layers 104, 105, 108, 109, and the conductive layers 106, 107, followed by patterning the material in the second interlayer dielectric region 124 to provide openings for the formation of interconnect vias 120, 122. The interconnect vias 120, 122 may be formed using a damascene process.

Figure 10A:
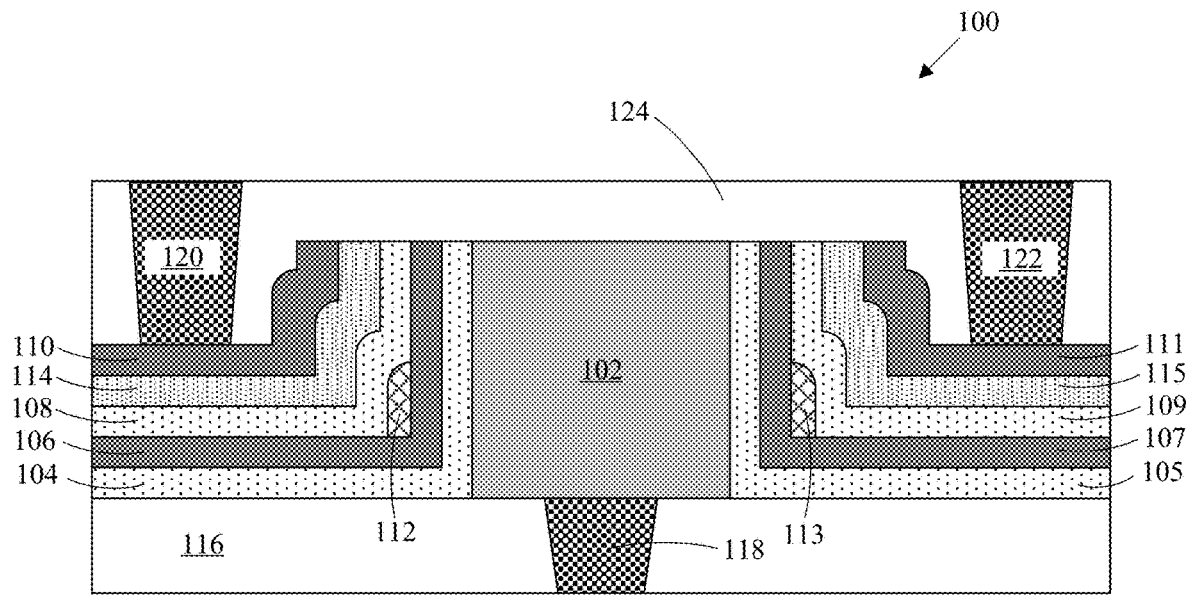
FIG. 10A through FIG. 10D are cross-sectional views of other exemplary memory devices including an oxygen scavenging layer.
Figure 10B:
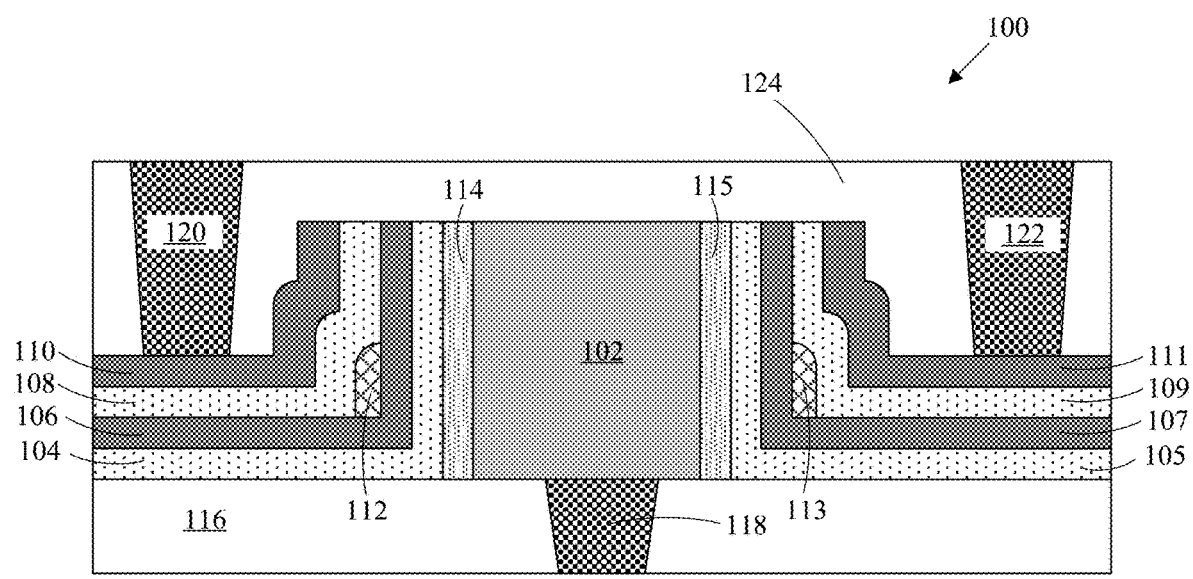

FIG. 10A through FIG. 10B depict modifications of the example memory device shown in FIG. 6, in which the example memory devices 100 includes oxygen scavenging layers 114, 115. As described herein, the oxygen scavenging layers 114, 115 may be formed, for example, using the deposition techniques described herein, or by oxidation of the electrode 102, and the conductive layers 106, 107.

As shown in FIG. 10A, a first oxygen scavenging layer 114 may be between the second electrode 110 and the second resistive layer 108. The first oxygen scavenging layer 114 may be in direct contact with the second electrode 110. The first oxygen scavenging layer 114 may also be disposed on or directly on the second resistive layer 108. A second oxygen scavenging layer 115 may be between the third electrode 111 and the fourth resistive layer 109. The second oxygen scavenging layer 115 may be in direct contact with the third electrode 111. The second oxygen scavenging layer 115 may also be disposed on or directly on the fourth resistive layer 109.

As shown in FIG. 10B, a first oxygen scavenging layer 114 may be between the first electrode 102 and the first resistive layer 104. A second oxygen scavenging layer 114 may be between the first electrode 102 and the third resistive layer 105. The oxygen scavenging layers 114, 115 may be in direct contact with the first electrode 102. For example, the oxygen scavenging layers 114, 115 may be disposed on or directly on the side surfaces of the first electrode 102.

Figure 10C:
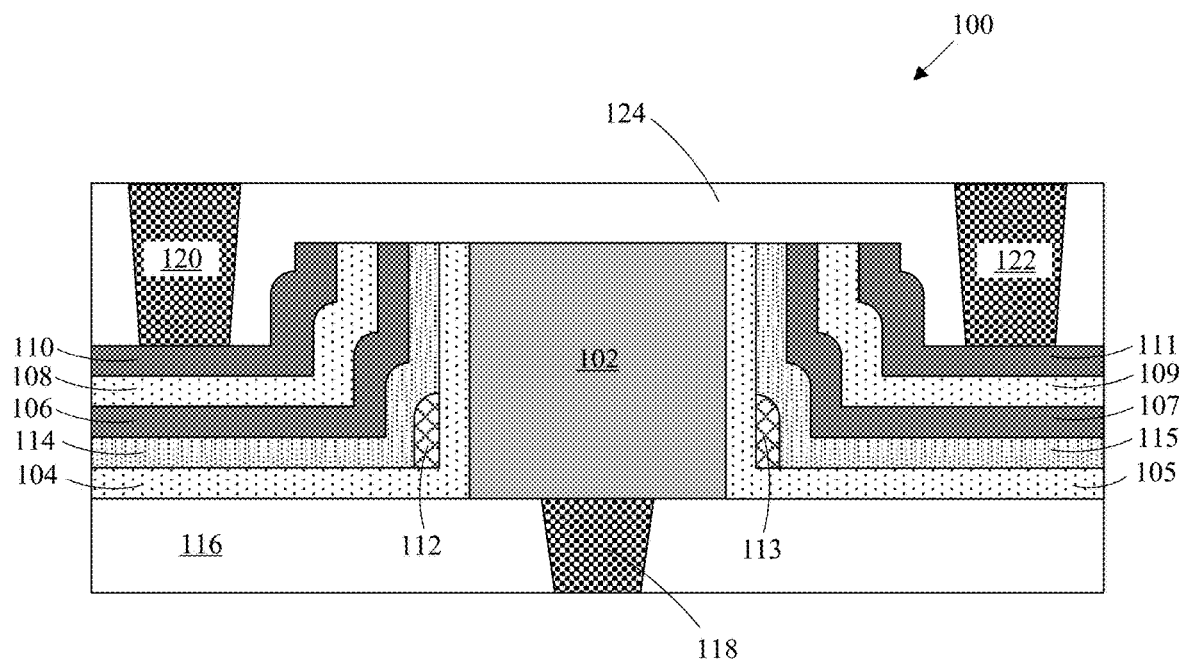

As shown in FIG. 10C, a first oxygen scavenging layer 114 may be between the first conductive layer 106 and the first resistive layer 104. The first oxygen scavenging layer 114 may be in direct contact with the conductive layer 106. The first oxygen scavenging layer 114 may also be disposed on or directly on the first resistive layer 104 and the first spacer element 112. A second oxygen scavenging layer 115 may be between the second conductive layer 107 and the third resistive layer 105. The second oxygen scavenging layer 115 may be in direct contact with the second conductive layer 107. The second oxygen scavenging layer 115 may also be disposed on or directly on the third resistive layer 105 and the second spacer element 113.

Figure 10D:
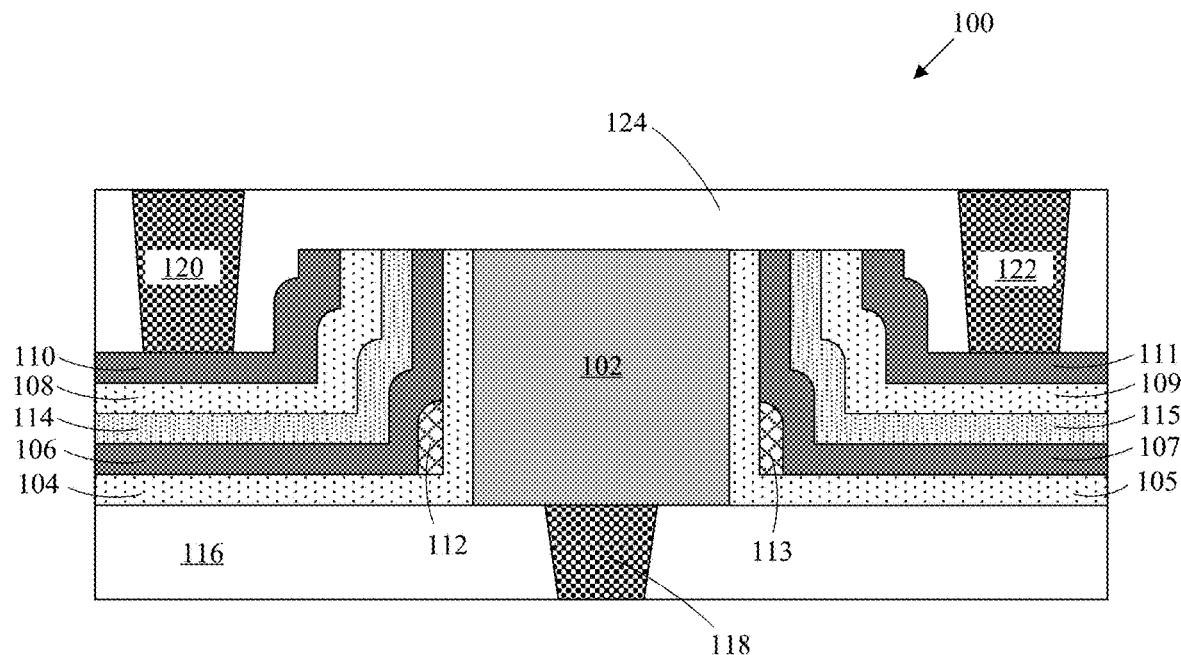

As shown in FIG. 10D, a first oxygen scavenging layer 114 may be between the first conductive layer 106 and the second resistive layer 108. The first oxygen scavenging layer 114 may be in direct contact with the first conductive layer 106. The second resistive layer 108 may be disposed on or directly on the first oxygen scavenging layer 114. A second oxygen scavenging layer 115 may be between the second conductive layer 107 and the fourth resistive layer 109. The second oxygen scavenging layer 115 may be in direct contact with the second conductive layer 107. The fourth resistive layer 109 may be disposed on or directly on the second oxygen scavenging layer 115.

Figure 11:
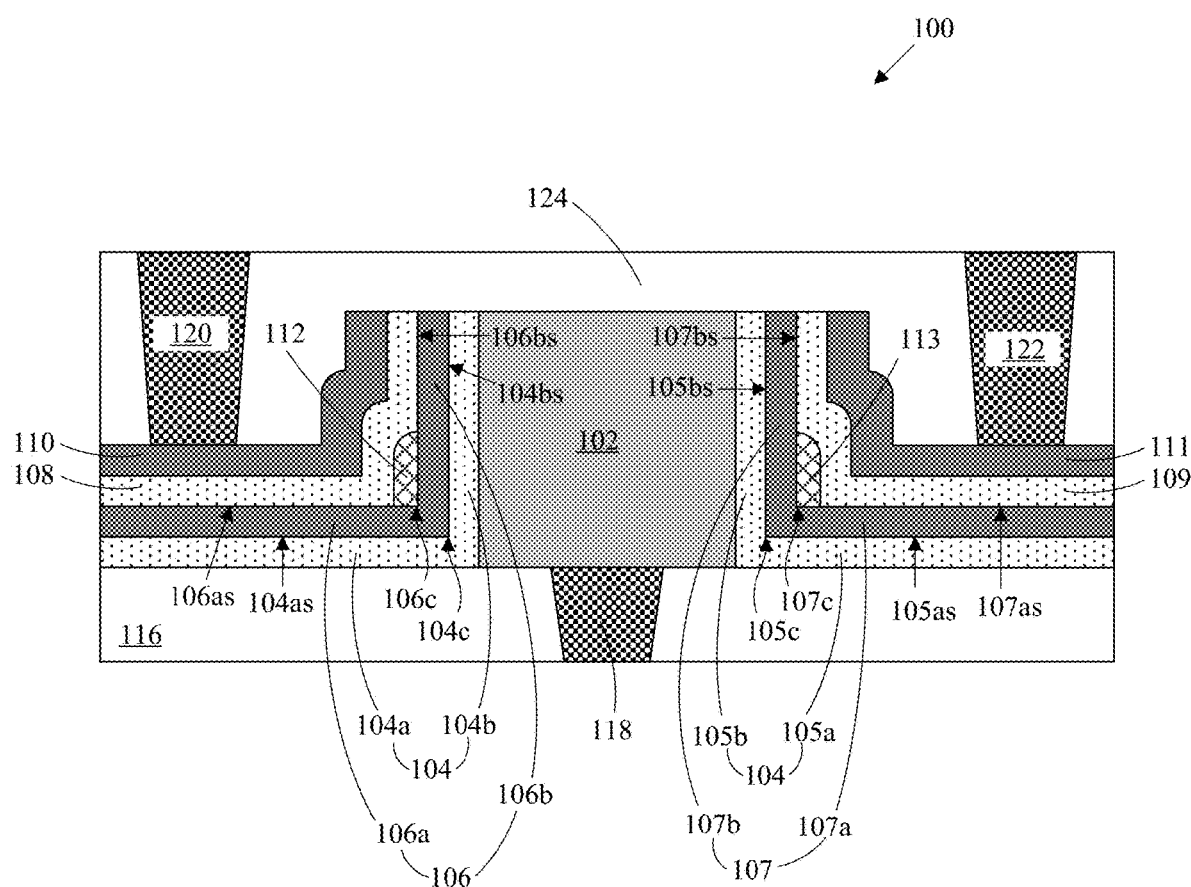
FIG. 11 is a cross-sectional view of another exemplary memory device.

Referring to FIG. 11, in which like reference numerals refer to like features in FIG. 1A, yet another example of a memory device 100 is presented. As shown, the first spacer element 112 may be between the first conductive layer 106 and the second resistive layer 108. The first conductive layer 106 may have a vertical portion 106$b$ and a horizontal portion 106$a$. The horizontal portion 106$a$ of the first conductive layer 106 may have an upper surface 106$as$ and the vertical portion 106$b$ of the first conductive layer 106 may have a side surface 106$bs$. The horizontal portion 106$a$ of the first conductive layer 106 may join the vertical portion 106$b$ of the first conductive layer 106 to provide a corner 106$c$ in the first conductive layer 106. The first resistive layer 104 may have a vertical portion 104$b$ and a horizontal portion 104$a$. The horizontal portion 104$a$ of the first resistive layer 104 may have an upper surface 104$as$ and the vertical portion 104$b$ of the first resistive layer 104 may have a side surface 104$bs$. The upper surface 104$as$ of the horizontal portion 104$a$ may join the side surface 104$bs$ of the vertical portion 104$b$ to provide a corner 104$c$ in the first resistive layer 104.

The first conductive layer 106 may be positioned over the first resistive layer 104. The first spacer element 112 may be disposed on or directly on the first conductive layer 106 to cover the corner 106$c$ in the first conductive layer 106. The second resistive layer 108 may be positioned over the first conductive layer 106 and the first spacer element 112, and the second electrode 110 may be positioned over the second resistive layer 108. The second resistive layer 108 may be deposited to conform to the contours of the first spacer element 112 and the first conductive layer 106. Likewise, the second electrode 110 may be deposited to conform to the contours of the second resistive layer 108.

Similarly, the second spacer element 113 may be between the second conductive layer 107 and the fourth resistive layer 109. The third resistive layer 105 may have a vertical portion 105$b$ and a horizontal portion 105$a$. The horizontal portion 105$a$ of the third resistive layer 105 may have an upper surface 105$as$ and the vertical portion 105$b$ of the third resistive layer 105 may have a side surface 105$bs$. The upper surface 105$as$ of the horizontal portion 105$a$ may join the side surface 105$bs$ of the vertical portion 105$b$ to provide a corner 105$c$ in the third resistive layer 105. The second conductive layer 107 may have a vertical portion 107$b$ and a horizontal portion 107$a$. The horizontal portion 107$a$ of the second conductive layer 107 may have an upper surface 107$as$ and the vertical portion 107$b$ of the second conductive layer 107 may have a side surface 107$bs$. The upper surface 107$as$ of the horizontal portion 107$a$ may join the side surface 107$bs$ of the vertical portion 107$b$ to provide a corner 107$c$ in the second conductive layer 107.

The second conductive layer 107 may be positioned over the third resistive layer 105. The second spacer element 113 may be disposed on or directly on the second conductive layer 107 to cover the corner 107$c$ in the second conductive layer 107. The fourth resistive layer 109 may be positioned over the second conductive layer 107 and the second spacer element 113, and the third electrode 111 may be positioned over the fourth resistive layer 109. The fourth resistive layer 109 may be deposited to conform to the contours of the second spacer element 113 and the second conductive layer 107. Likewise, the third electrode 111 may be deposited to conform to the contours of the fourth resistive layer 109.

In some embodiments, the vertical portion 104b of the first resistive layer 104 and the vertical portion 105b of the third resistive layer 105 may be in direct contact with the side surfaces of the first electrode 102. The first conductive layer 106 may be disposed on or directly on the first resistive layer 104 and the second conductive layer 107 may be disposed on or directly on the third resistive layer 105. The first spacer element 112 may be disposed on or directly on the first conductive layer 106 and the second spacer element 113 may be disposed on or directly on the second conductive layer 107. The second resistive layer 108 may be disposed on or directly on the first conductive layer 106 and the first spacer element 112. The fourth resistive layer 109 may be disposed on or directly on the second conductive layer 107 and the second spacer element 113. The second electrode 110 may be disposed on or directly on the second resistive layer 108 and the third electrode 111 may be disposed on or directly on the fourth resistive layer 109.

As mentioned above, the spacer elements 112, 113 may function as electrical insulators. The covering of the corner 106c in the first conductive layer 106 with the first spacer element 112 and the covering to the corner 107c in the second conductive layer 107 with the second spacer element 113 may advantageously ensure confinement of the conductive paths (not shown) at the respective upper edges of the electrodes 102, 110, 111 and the conductive layers 106, 107.

Although not shown in the accompanying drawings, the memory device 100 in FIG. 11 may be modified such that the second electrode 110 and the third electrode 111 may have respective upper surfaces that are substantially coplanar with an upper surface of the first electrode 102.

Figure 12:
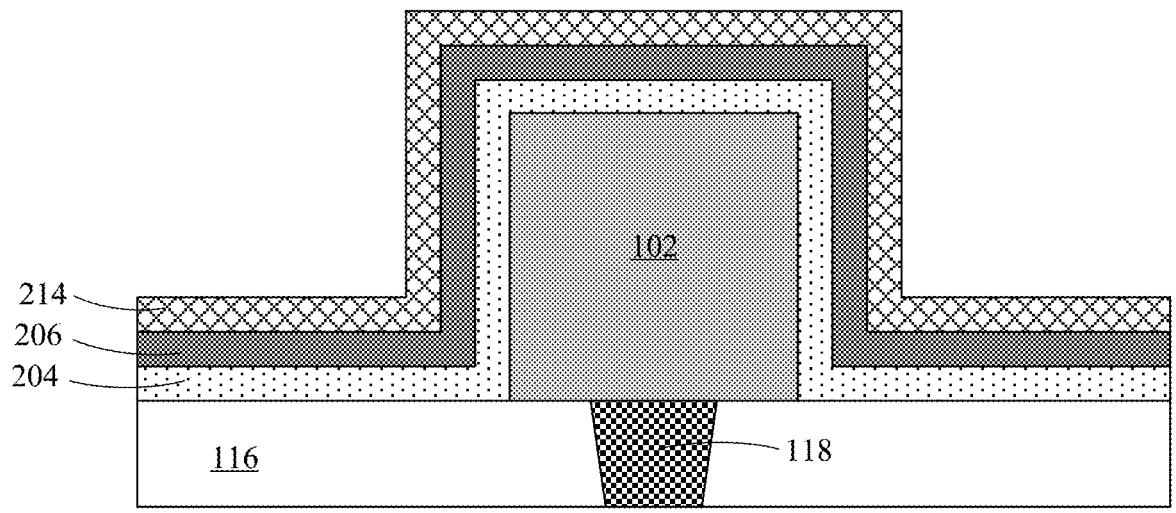
FIG. 12, FIG. 13, and FIG. 14 are cross-sectional views depicting another set of steps for fabricating an exemplary memory device.
Figure 13:
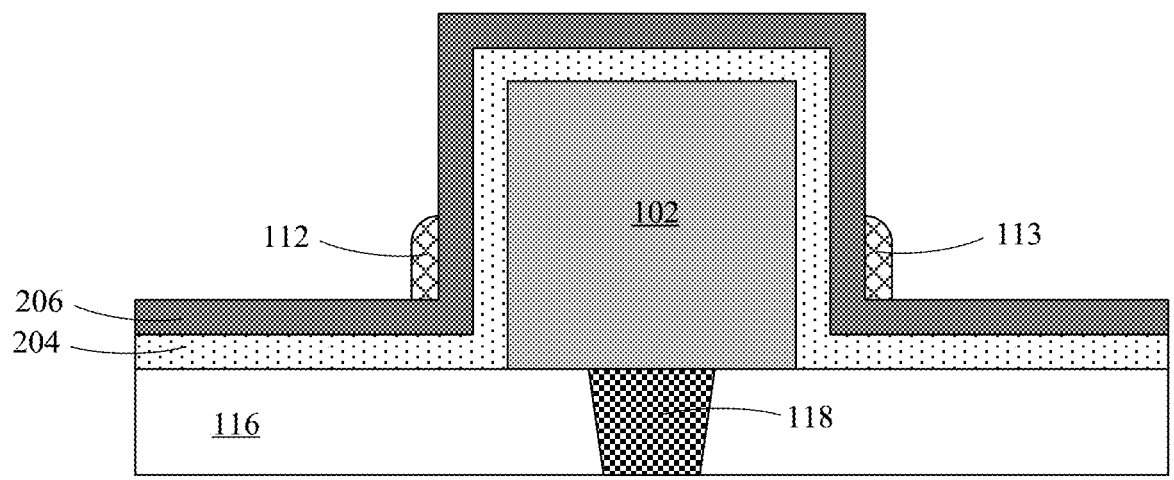
Figure 14:
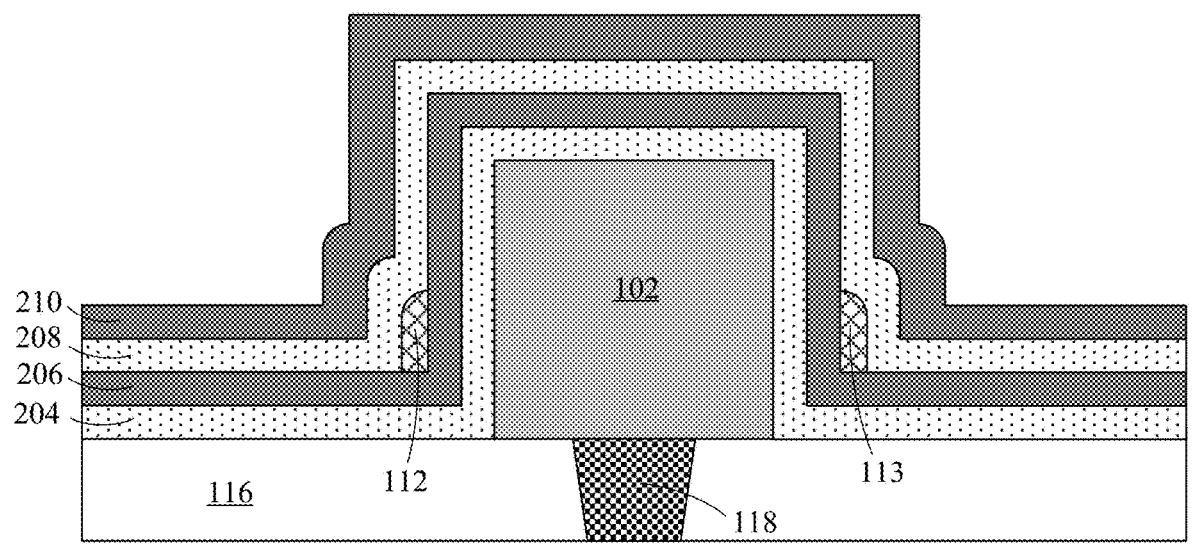

FIGS. 12 through 14 show a set of steps that may be used to create the memory device shown in FIG. 11.

Referring to FIG. 12, a first interlayer dielectric region 116 may be formed above active components of an integrated circuit chip (e.g., in a back end of line portion). For example, the first interlayer dielectric region 116 may be formed above a substrate (not shown). Interconnect via 118 may be formed in the first interlayer dielectric region 116. A first electrode 102 may be formed on the first interlayer dielectric region 116 and in contact with the interconnect via 118. Formation of the first electrode 102 may include the deposition of a conductive material layer followed by the patterning of the deposited layer.

A first resistive material layer 204 may be formed on the first interlayer dielectric region 116 and the first electrode 102. The first resistive material layer 204 may cover the upper surface and the side surface of the first electrode 102. A conductive layer 206 may be formed on the first resistive material layer 204. A spacer element layer 214 may be formed on the conductive layer 206. Formation of the layers 204, 206, 214 may be performed, for example, using deposition techniques described herein. Preferably, a conformal deposition process such as an ALD process or a highly conformal CVD process may be used.

Referring to FIG. 13, the spacer element layer 214 may be etched to form the spacer elements 112, 113. The etching of the spacer element layer 214 may expose portions of the underlying conductive layer 206. As described herein, the formed spacer elements 112, 113 may cover corners in the conductive layer 206. The etching of the spacer element layer 214 may include the use of an anisotropic etching process (i.e., directional etching), in which the etching may be performed in a substantially vertical direction.

Referring to FIG. 14, a second resistive material layer 208 may be formed on the conductive layer 206 and the spacer elements 112, 113. An electrode layer 210 may be formed on the second resistive material layer 208. The layers 208, 210 may be formed using the deposition techniques described herein. In the example shown in FIG. 14, a conformal deposition process such as an ALD process or a highly conformal CVD process may be used to deposit the layers 208, 210. Alternatively, in another example (not shown), a conformal deposition process such as an ALD process or a highly conformal CVD process may be used to deposit the layer 208, while a non-conformal deposition process may be used to deposit the layer 210.

The structure in FIG. 14 may be subjected to further processing to form the structure shown in FIG. 11. For example, a chemical mechanical planarization (CMP) process may be performed to expose the upper surface of the first electrode 102. The CMP process may be stopped upon exposing the upper surface of the first electrode 102. The CMP process may remove a portion of the respective layers 210, 208, 206, 204. The first 104 and the third 105 resistive layers may be formed from the deposited layer 204 after the CMP process. The first 106 and the second 107 conductive layers may be formed from the deposited layer 206 after the CMP process. The second 108 and the fourth 109 resistive layers may be formed from the layer 208 after the CMP process. The second electrode 110 and the third electrode 111 may be formed from the layer 210 after the CMP process. Subsequently, a second interlayer dielectric region 124 may be formed over the electrodes 102, 110, 111, the resistive layers 104, 105, 108, 109, and the conductive layers 106, 107, followed by patterning the material in the second interlayer dielectric region 124 to provide openings for the formation of interconnect vias 120, 122. The interconnect vias 120, 122 may be formed using a damascene process.

Figure 15A:
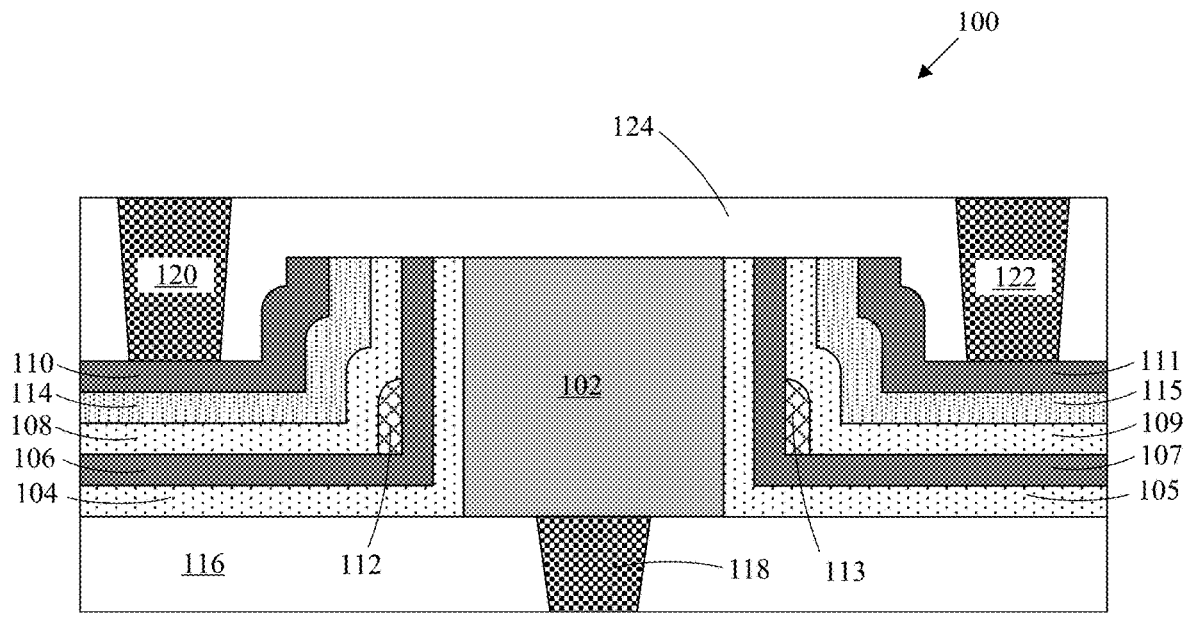
FIG. 15A through FIG. 15D are cross-sectional views of other exemplary memory devices including an oxygen scavenging layer.
Figure 15B:
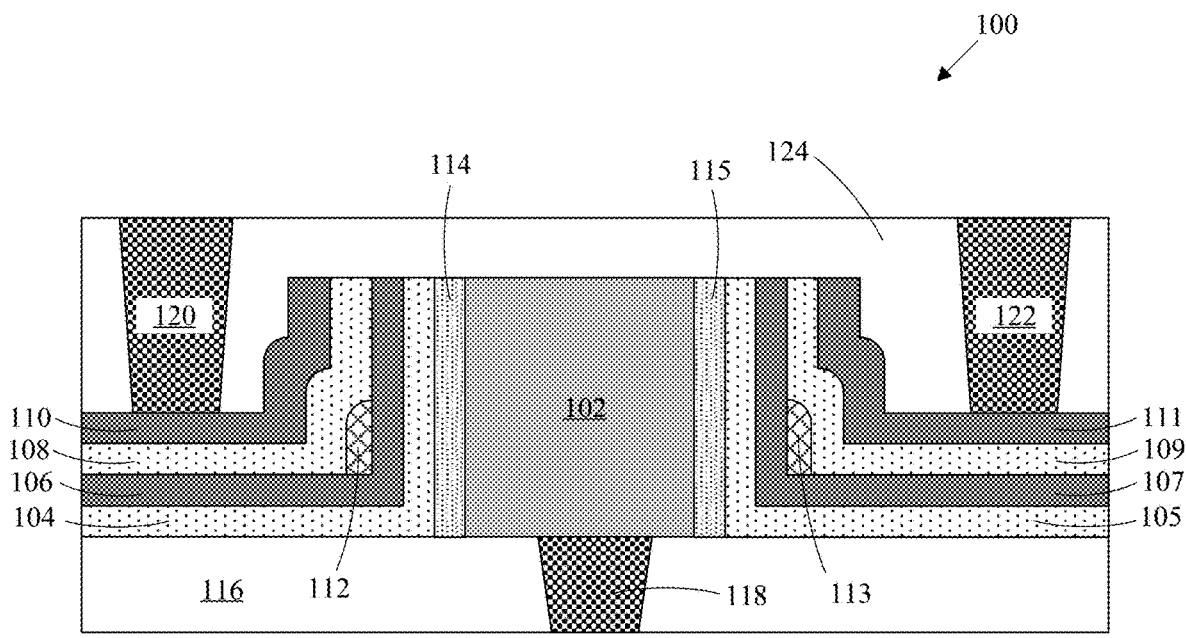

FIG. 15A through FIG. 15B depict modifications of the example memory device shown in FIG. 11, in which the example memory devices 100 includes oxygen scavenging layers 114, 115. As described herein, the oxygen scavenging layers 114, 115 may be formed, for example, using the deposition techniques described herein, or by oxidation of the electrode 102, and the conductive layers 106, 107.

As shown in FIG. 15A, a first oxygen scavenging layer 114 may be between the second electrode 110 and the second resistive layer 108. The first oxygen scavenging layer 114 may be in direct contact with the second electrode 110. The first oxygen scavenging layer 114 may also be disposed on or directly on the second resistive layer 108. A second oxygen scavenging layer 115 may be between the third electrode 111 and the fourth resistive layer 109. The second oxygen scavenging layer 115 may be in direct contact with the third electrode 111. The second oxygen scavenging layer 115 may also be disposed on or directly on the fourth resistive layer 109.

As shown in FIG. 15B, a first oxygen scavenging layer 114 may be between the first electrode 102 and the first resistive layer 104. A second oxygen scavenging layer 114 may be between the first electrode 102 and the third resistive layer 105. The oxygen scavenging layers 114, 115 may be in direct contact with the first electrode 102. For example, the oxygen scavenging layers 114, 115 may be disposed on or directly on the side surfaces of the first electrode 102.

Figure 15C:
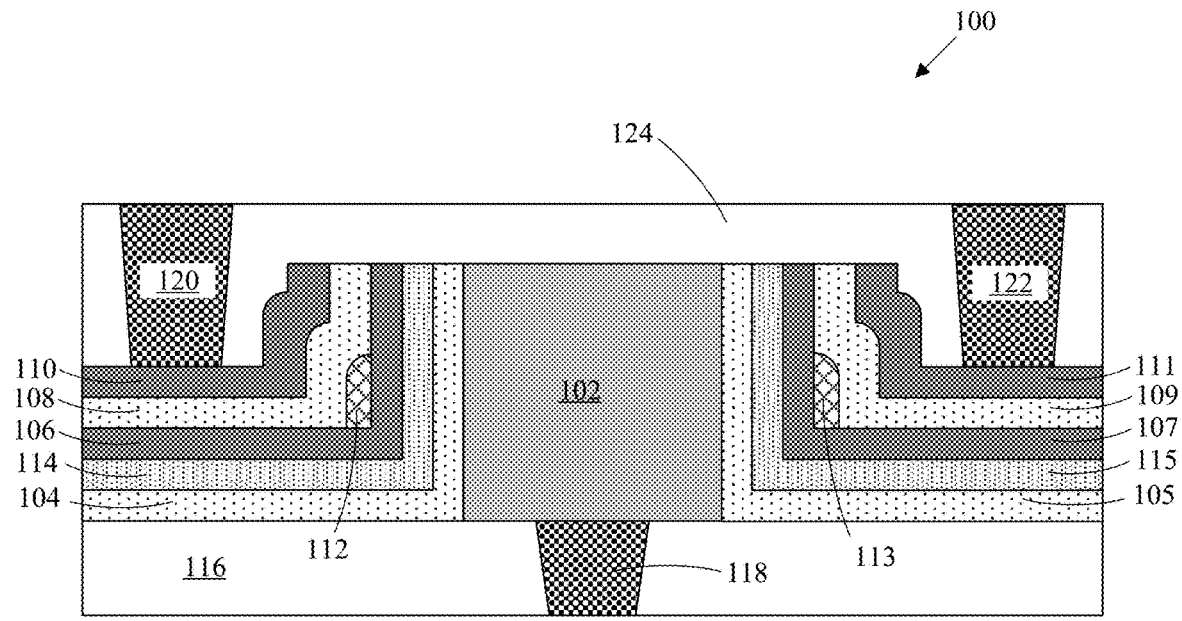

As shown in FIG. 15C, a first oxygen scavenging layer 114 may be between the first conductive layer 106 and the first resistive layer 104. The first oxygen scavenging layer 114 may be in direct contact with the first conductive layer 106. The first oxygen scavenging layer 114 may also be disposed on or directly on the first resistive layer 104. A second oxygen scavenging layer 115 may be between the second conductive layer 107 and the third resistive layer 105. The second oxygen scavenging layer 115 may be in direct contact with the second conductive layer 107. The second oxygen scavenging layer 115 may also be disposed on or directly on the third resistive layer 105 and the second spacer element 113.

Figure 15D:
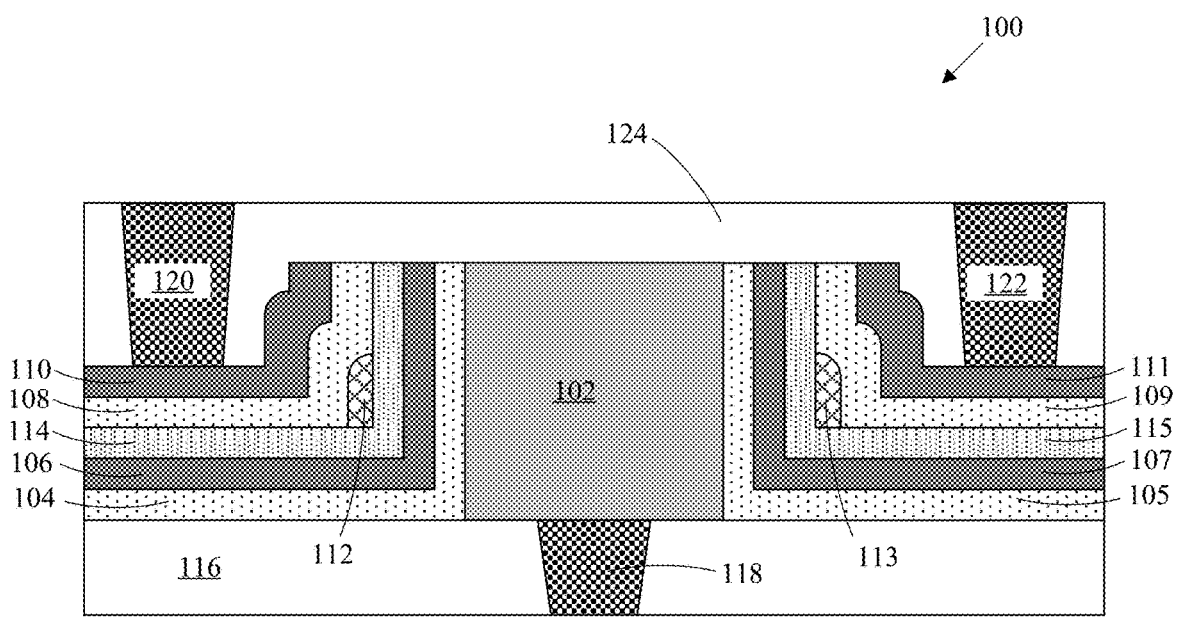

As shown in FIG. 15D, a first oxygen scavenging layer 114 may be between the first conductive layer 106 and the second resistive layer 108. The first oxygen scavenging layer 114 may be in direct contact with the first conductive layer 106. The first spacer element 112 may be disposed on or directly on the first conductive layer 106. The second resistive layer 108 may be disposed on or directly on the first oxygen scavenging layer 114 and the first spacer element 112. A second oxygen scavenging layer 115 may be between the second conductive layer 107 and the fourth resistive layer 109. The second oxygen scavenging layer 115 may be in direct contact with the second conductive layer 107. The second spacer element 113 may be disposed on or directly on the second conductive layer 107. The fourth resistive layer 109 may be disposed on or directly on the second oxygen scavenging layer 115 and the second spacer element 113.

Throughout this disclosure, it is to be understood that if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description. Additionally, the various tasks and processes described herein may be incorporated into a more comprehensive procedure or process having additional functionality not described in detail herein.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

As will be readily apparent to those skilled in the art upon a complete reading of the present application, the disclosed semiconductor devices and methods of forming the same may be employed in manufacturing a variety of different integrated circuit products, including, but not limited to, memory cells, NV memory devices, FinFET transistor devices, CMOS devices, etc.

What is claimed is:

1. A memory device comprising:
a first electrode above an interlayer dielectric region;
a second electrode above the interlayer dielectric region, the second electrode is laterally adjacent to the first electrode;
a conductive layer between the first electrode and the second electrode, wherein the conductive layer is electrically isolated;
a first resistive layer between the first electrode and the conductive layer;
a second resistive layer between the second electrode and the conductive layer, the second resistive layer has a vertical portion and a horizontal portion, the horizontal portion having an upper surface, the vertical portion having a side surface, the upper surface of the horizontal portion joins the side surface of the vertical portion to provide a corner in the second resistive layer; and
a spacer element between the second electrode and the second resistive layer, the spacer element covers the corner in the second resistive layer.

2. The device of claim 1, further comprising an oxygen scavenging layer between the second electrode and the second resistive layer, wherein the oxygen scavenging layer is in direct contact with the second electrode.

3. The device of claim 2, wherein the oxygen scavenging layer is disposed directly on the second resistive layer and the spacer element.

4. The device of claim 1, further comprising an oxygen scavenging layer between the first electrode and the first resistive layer, wherein the oxygen scavenging layer is in direct contact with the first electrode.

5. The device of claim 1, further comprising an oxygen scavenging layer between the conductive layer and the first resistive layer, wherein the oxygen scavenging layer is in direct contact with the conductive layer.

6. The device of claim 1, further comprising an oxygen scavenging layer between the conductive layer and the second resistive layer, wherein the oxygen scavenging layer is in direct contact with the conductive layer.

7. The device of claim 1, wherein the first resistive layer has a vertical portion and a horizontal portion, and wherein the first electrode has a side surface and the vertical portion of the first resistive layer is positioned over the side surface of the first electrode.

8. The device of claim 7, wherein the conductive layer is positioned over the first resistive layer, the second resistive layer is positioned over the conductive layer, and the second electrode is positioned over the second resistive layer.

9. A memory device comprising:
a first electrode above an interlayer dielectric region;
a second electrode above the interlayer dielectric region, the second electrode is laterally adjacent to the first electrode;
a conductive layer between the first electrode and the second electrode, wherein the conductive layer is electrically isolated;
a first resistive layer between the first electrode and the conductive layer, the first resistive layer has a vertical portion and a horizontal portion, the horizontal portion having an upper surface, the vertical portion having a side surface, the upper surface of the horizontal portion joins the side surface of the vertical portion to provide a corner in the first resistive layer;

a second resistive layer between the second electrode and the conductive layer; and a spacer element between the conductive layer and the first resistive layer, wherein the spacer element covers the corner in the first resistive layer.

10. The device of claim 9, further comprising an oxygen scavenging layer between the second electrode and the second resistive layer, wherein the oxygen scavenging layer is in direct contact with the second electrode.

11. The device of claim 9, further comprising an oxygen scavenging layer between the first electrode and the first resistive layer, wherein the oxygen scavenging layer is in direct contact with the first electrode.

12. The device of claim 9, further comprising an oxygen scavenging layer between the conductive layer and the first resistive layer, wherein the oxygen scavenging layer is in direct contact with the conductive layer.

13. The device of claim 12, wherein the oxygen scavenging layer is disposed directly on the first resistive layer and the spacer element.

14. The device of claim 9, further comprising an oxygen scavenging layer between the conductive layer and the second resistive layer, wherein the oxygen scavenging layer is in direct contact with the conductive layer.

15. A memory device comprising:

a first electrode above an interlayer dielectric region;

a second electrode above the interlayer dielectric region, the second electrode is laterally adjacent to the first electrode;

a conductive layer between the first electrode and the second electrode, the conductive layer has a vertical portion and a horizontal portion, the horizontal portion having an upper surface, the vertical portion having a side surface, the upper surface of the horizontal portion joins the side surface of the vertical portion to provide a corner in the conductive layer, wherein the conductive layer is electrically isolated;

a first resistive layer between the first electrode and the conductive layer;

a second resistive layer between the second electrode and the conductive layer; and a spacer element between the conductive layer and the second resistive layer, wherein the spacer element covers the corner in the conductive layer.

16. The device of claim 15, further comprising an oxygen scavenging layer between the second electrode and the second resistive layer, wherein the oxygen scavenging layer is in direct contact with the second electrode.

17. The device of claim 15, further comprising an oxygen scavenging layer between the first electrode and the first resistive layer, wherein the oxygen scavenging layer is in direct contact with the first electrode.

18. The device of claim 15, further comprising an oxygen scavenging layer between the conductive layer and the first resistive layer, wherein the oxygen scavenging layer is in direct contact with the conductive layer.

19. The device of claim 15, further comprising an oxygen scavenging layer between the conductive layer and the second resistive layer, wherein the oxygen scavenging layer is in direct contact with the conductive layer.

20. The device of claim 19, wherein the second resistive layer is disposed directly on the oxygen scavenging layer and the spacer element.

* * * * *